(12) United States Patent
Lee

(10) Patent No.: US 10,886,003 B2
(45) Date of Patent: Jan. 5, 2021

(54) SEMICONDUCTOR MEMORY DEVICE, OPERATING METHOD THEREOF, AND MEMORY SYSTEM

(71) Applicant: SK hynix Inc., Gyeonggi-do (KR)

(72) Inventor: Jae Ho Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/262,347

(22) Filed: Jan. 30, 2019

(65) Prior Publication Data

US 2020/0005886 A1    Jan. 2, 2020

(30) Foreign Application Priority Data

Jun. 27, 2018    (KR) .................. 10-2018-0074377

(51) Int. Cl.
| | | |
|---|---|---|
| *G11C 16/32* | (2006.01) | |
| *G11C 29/50* | (2006.01) | |
| *G11C 16/08* | (2006.01) | |
| *G11C 16/30* | (2006.01) | |
| *G11C 16/04* | (2006.01) | |
| *G11C 5/14* | (2006.01) | |

(52) U.S. Cl.
CPC .............. *G11C 29/50* (2013.01); *G11C 5/145* (2013.01); *G11C 16/0483* (2013.01); *G11C 16/08* (2013.01); *G11C 16/30* (2013.01); *G11C 16/32* (2013.01); *G11C 2029/5004* (2013.01); *G11C 2029/5006* (2013.01)

(58) Field of Classification Search
CPC ..... G11C 29/50; G11C 5/145; G11C 16/0483; G11C 16/08; G11C 16/30; G11C 16/32
See application file for complete search history.

(56) References Cited

U.S. PATENT DOCUMENTS

| | | | |
|---|---|---|---|
| 8,693,254 B2 | 4/2014 | Hashimoto | |
| 9,899,098 B1* | 2/2018 | Kaneko | ................. G11C 16/26 |
| 2013/0194868 A1* | 8/2013 | Hashimoto | ........ G11C 16/0483 |
| | | | 365/185.11 |

FOREIGN PATENT DOCUMENTS

| | | |
|---|---|---|
| KR | 100596330 | 7/2006 |
| KR | 1020090098173 | 9/2009 |

* cited by examiner

*Primary Examiner* — Alfredo Bermudez Lozada
(74) *Attorney, Agent, or Firm* — IP & T Group LLP

(57) ABSTRACT

A semiconductor memory device includes a switching controller, a voltage generator and control logic. The switching controller is connected to a local word line. The voltage generator, connected to the switching controller, is configured to generate an operating voltage according to an input clock signal and transfer the operating voltage to the switching controller. The control logic is configured to control operations of the voltage generator and the switching controller. The control logic is configured to detect an amount of leakage current of the local word line by counting a number of pulses of the input clock signal.

13 Claims, 21 Drawing Sheets

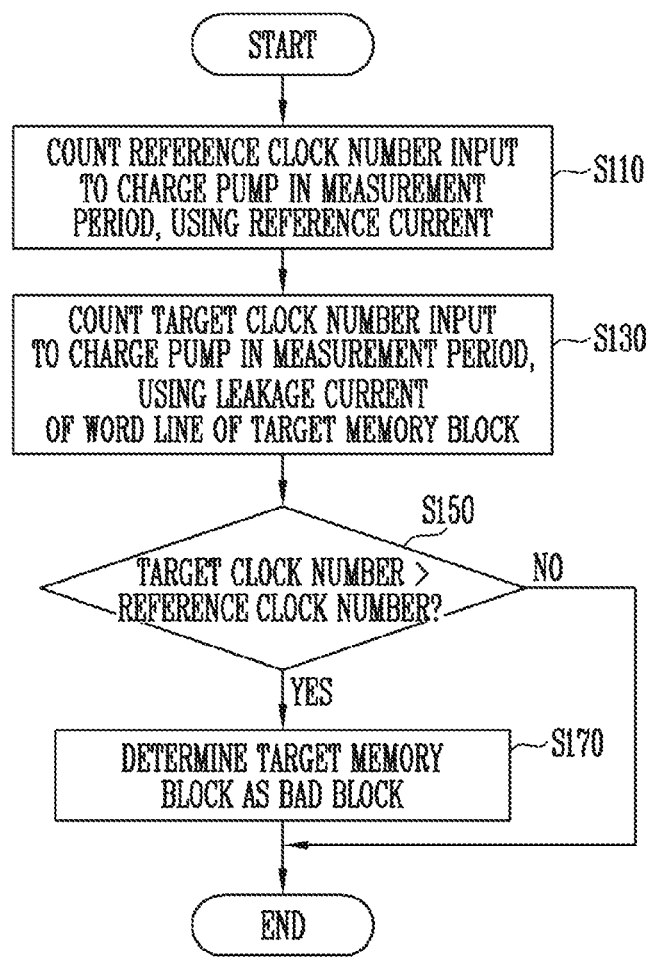

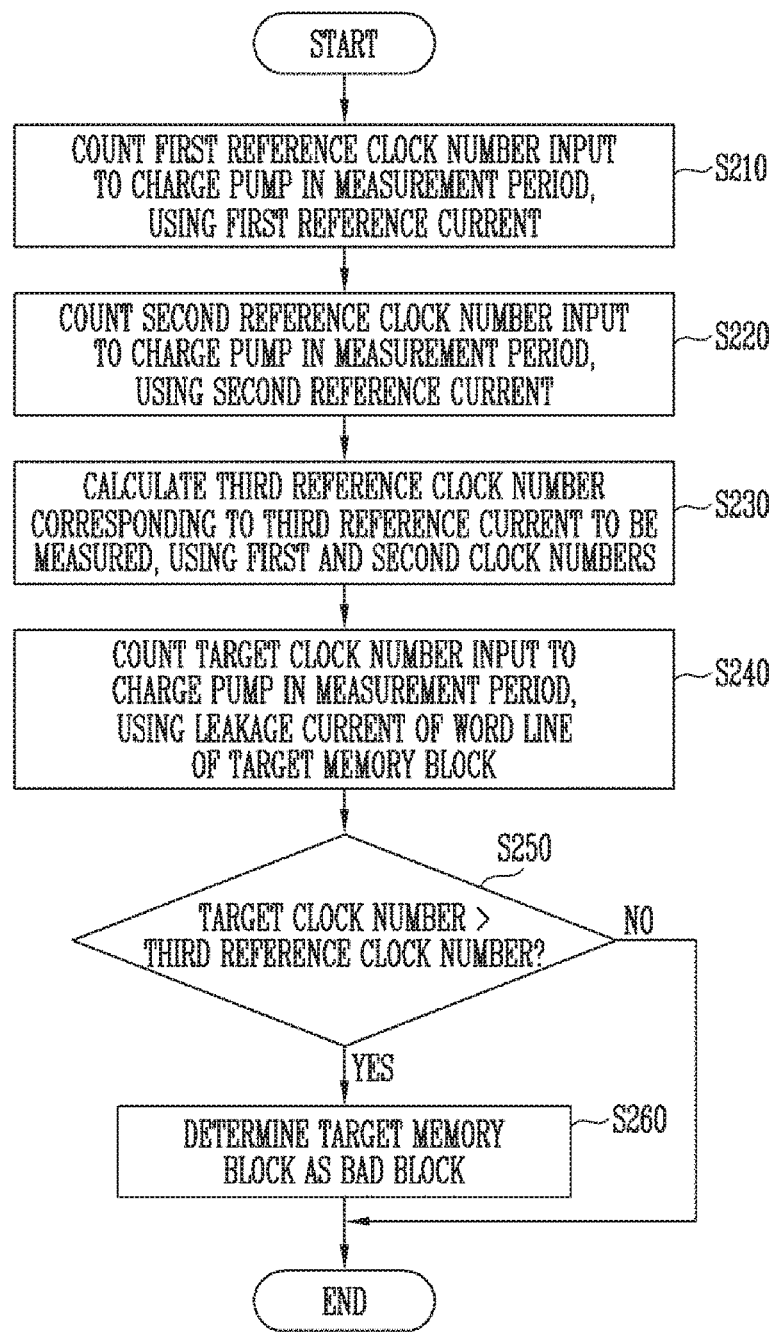

SEMICONDUCTOR MEMORY DEVICE, OPERATING METHOD THEREOF, AND MEMORY SYSTEM

CROSS-REFERENCE TO RELATED APPLICATION

The present application claims priority under 35 U.S.C. § 119(a) to Korean patent application number 10-2018-0074377, filed on Jun. 27, 2018, which is incorporated herein by reference in its entirety.

BACKGROUND

1. Field of Invention

Various embodiments of the present disclosure generally relate to an electronic device. Particularly, the embodiments relate to a semiconductor memory device, an operating method thereof, and a memory system.

2. Description of Related Art

Memory devices may be formed in a two-dimensional structure in which strings are arranged horizontally to a semiconductor substrate, or be formed in a three-dimensional structure in which strings are arranged vertically to a semiconductor substrate. A three-dimensional semiconductor device was devised in order to overcome the degree of integration limit in two-dimensional semiconductor devices, and may include a plurality of memory cells vertically stacked on a semiconductor substrate.

SUMMARY

Embodiments provide a semiconductor memory device, which can measure a leakage current of a word line, an operating method thereof and a memory system including the same.

According to an aspect of the present disclosure, there is provided a semiconductor memory device including: a switching controller connected to a local word line; a voltage generator, connected to the switching controller, configured to generate an operating voltage according to an input clock signal and transfer the operating voltage to the switching controller; and control logic configured to control operations of the voltage generator and the switching controller, wherein the control logic is configured to detect an amount of leakage current of the local word line by counting a number of pulses of the input clock signal.

According to another aspect of the present disclosure, there is provided a method for operating a semiconductor memory device, the method including: counting a number of pulses of a clock signal input to a charge pump during a measurement period based on a reference current (reference clock number); counting a number of pulses of the clock signal input to the charge pump during the measurement period based on a leakage current of a word line of a target memory block (target clock number); and determining whether the leakage current of the word line is larger than the reference current by comparing the reference clock number and the target clock number.

According to still another aspect of the present disclosure, there is provided a method for operating a semiconductor memory device, the method including: counting a number of pulses of a clock signal input to a charge pump during a measurement period, based on a first reference current (first reference clock number); counting a number of pulses of the clock signal input to the charge pump during the measurement period based on a second reference current different from the first reference current (second reference clock number); calculating a third reference clock number corresponding to a third reference current based on the first reference clock number and the second reference clock number; counting a number of pulses of the clock signal input to the charge pump during the measurement period based on a leakage current of a local word line of a target memory block (target clock number); and determining whether current has been leaked through the target memory block by comparing the third reference clock number with the target clock number.

According to still another aspect of the present disclosure, there is provided a memory system including: a plurality of semiconductor memory devices; a power manager configured to manage power transferred to the plurality of semiconductor memory devices; and a memory controller configured to control operations of the plurality of semiconductor memory devices and the power manager, wherein each of the plurality of semiconductor memory devices includes: a memory cell array including a plurality of memory blocks; and a leakage current detector configured to detect a leakage current each of the plurality of memory blocks.

BRIEF DESCRIPTION OF THE DRAWINGS

Various embodiments will now be described more fully hereinafter with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Throughout the specification, reference to "an embodiment," "another embodiment," or the like is not necessarily to only one embodiment, and different references to any such phrase are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

FIG. 12 is a flowchart illustrating a method for detecting a leakage current in the semiconductor memory device according to an embodiment of the present disclosure.

FIG. 15 is a flowchart illustrating a method for detecting a leakage current in the semiconductor memory device according to another embodiment of the present disclosure.

DETAILED DESCRIPTION

Figure 1:
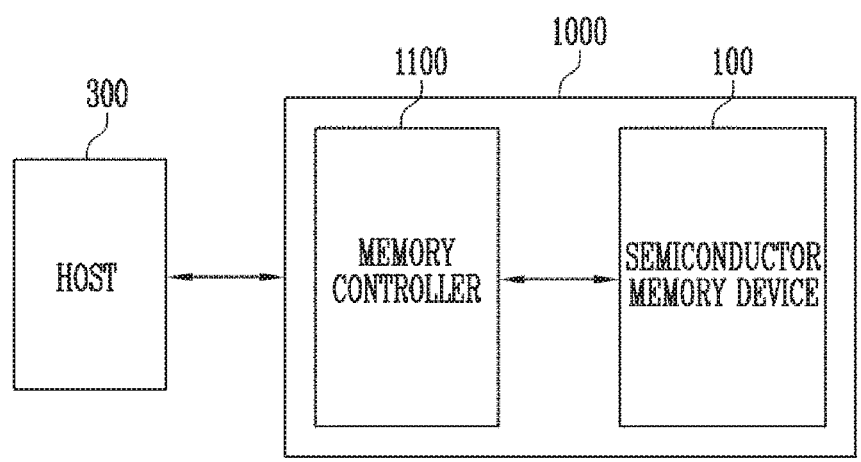
FIG. 1 is a block diagram illustrating an example of a memory system.

In the present disclosure, advantages, features and methods for achieving them will become more apparent in light of the embodiments described below with reference to the drawings. Elements and features of the present disclosure may, however, be embodied in different forms and thus the present invention is not limited to the embodiments set forth herein. Rather, these embodiments are provided to enable those skilled in the art to which the disclosure pertains to practice the present invention.

In the entire specification, when an element is referred to as being "connected" or "coupled" to another element, it can be directly connected or coupled to the another element or be indirectly connected or coupled to another element with one or more intervening elements interposed therebetween. In addition, when an element is referred to as "including" a component, this indicates that the element may further one or more other components instead of excluding such other component(s), unless stated or the context indicates otherwise.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Various embodiments of the present disclosure will be described in detail with reference to the accompanying drawings. The same reference numerals are used to designate the same elements as those shown in other drawings. In the following description, detail of well-known technical concepts may not be provided so as to not unnecessarily obscure aspects and features of the embodiments.

FIG. 1 is a block diagram illustrating an example of a memory system.

Referring to FIG. 1, the memory system 1000 includes a semiconductor memory device 100 and a memory controller 1100.

The semiconductor memory device 100 operates under the control of the memory controller 1100. More specifically, the semiconductor memory device 100 writes data in a memory cell array in response to a write request from the memory controller 1100. When a write command, an address, and data are received as the write request from the memory controller 1100, the semiconductor memory device 100 writes data in memory cells indicated by the address.

The semiconductor memory device 100 performs a read operation in response to a read request from the memory controller 1100. When a read command and an address are received as the read request from the memory controller 1100, the semiconductor memory device 100 reads data of memory cells indicated by the address, and outputs the read data to the memory controller 1100.

The semiconductor memory device 100 may be a NAND flash memory, a vertical NAND (hereinafter, referred to as 'VNAND') flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. Also, the semiconductor memory device 100 of the present disclosure may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

The memory controller 1100 is connected between the semiconductor memory device 100 and a host 300. The semiconductor memory controller 1100 is configured to interface the host 300 and the semiconductor memory device 100. The memory controller 1100 may transmit a write request or a read request to the semiconductor memory device 100 under the control of the host 300.

Figure 2:
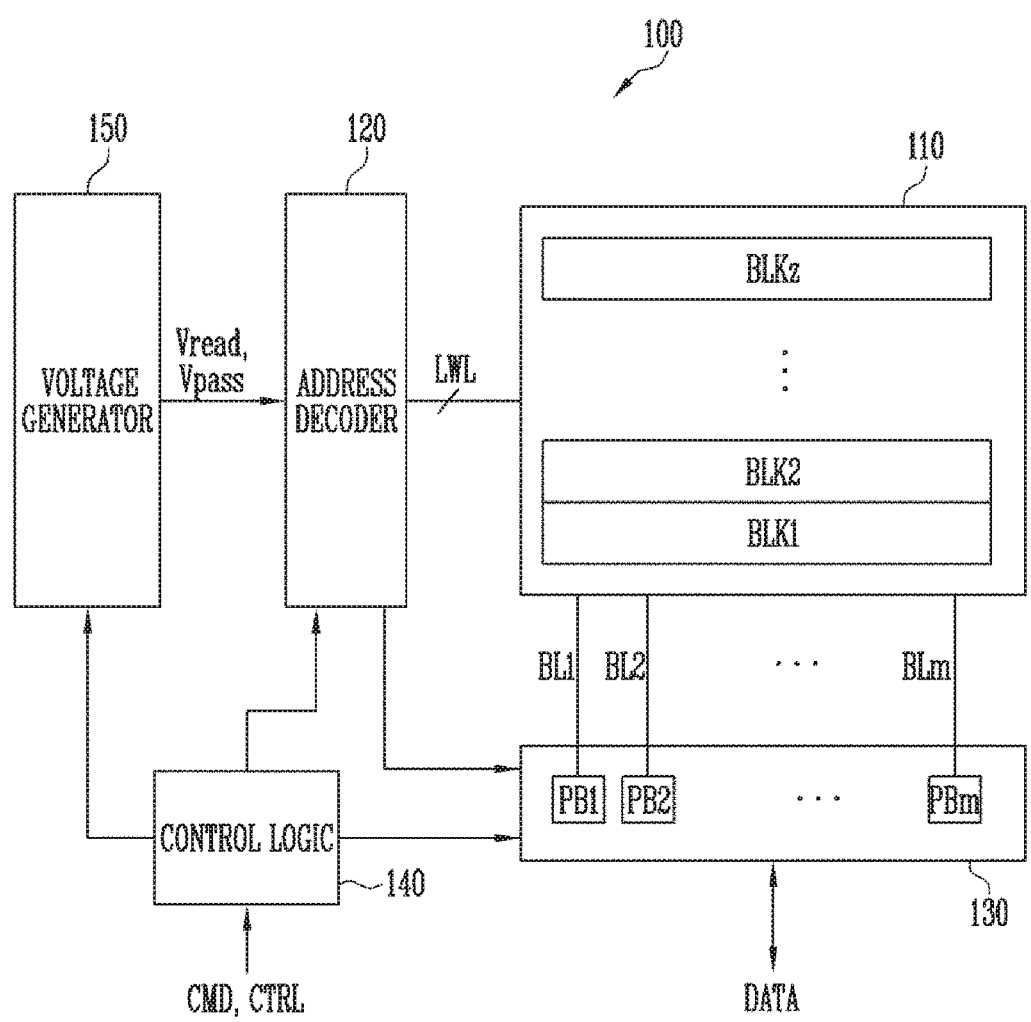
FIG. 2 is a block diagram illustrating an exemplary semiconductor memory device of FIG. 1.

FIG. 2 is a block diagram illustrating an exemplary semiconductor memory device of FIG. 1.

Referring to FIG. 2, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The memory blocks BLK1 to BLKz are connected to the address decoder 120 through local word lines LWL. The memory blocks BLK1 to BLKz are connected to the read/write circuit 130 through bit lines BL1 to BLm. Each of the plurality of memory blocks BLK1 to BLKz includes a plurality of memory cells. In an embodiment, the memory cells are nonvolatile memory cells, which may be configured to have a vertical channel structure. The memory cell array 110 may be configured as a two-dimensional structure. In some embodiments, the memory cell array 110 may be configured as a three-dimensional structure. Each of the memory cells in the memory cell array 110 may store data of at least one bit. In an embodiment, each of the memory cells in the memory cell array 110 may be a single-level cell (SLC) that stores data of one bit. In another embodiment, each of the memory cells in the memory cell array 110 may be a multi-level cell (MLC) that stores data of two bits. In still another embodiment, each of the memory cells in the memory cell array 110 may be a triple-level cell that stores data of three bits. In still another embodiment, each of the memory cells in the memory cell array 110 may be a quad-level cell that stores data of four bits. In some embodiments, the memory cell array 110 may include a plurality of memory cells that each stores data of five or more bits.

The address decoder 120, the read/write circuit 130, the control logic 140, and the voltage generator 150 operate as a peripheral circuit that drives the memory cell array 110. The address decoder 120 is connected to the memory cell array 110 through the local word lines LWL. The address decoder 120 is configured to operate under the control of the control logic 140. The address decoder 120 receives an address through an input/output buffer (not shown) provided in the semiconductor memory device 100.

The address decoder 120 is configured to decode a block address in the received address. The address decoder 120 selects at least one memory block according to the decoded block address. In a read voltage application operation during a read operation, the address decoder 120 applies a read voltage Vread generated by the voltage generator 150 to a selected word line among the selected memory blocks, and applies a pass voltage Vpass to the other unselected word lines. In a program verify operation, the address decoder 120 applies a verify voltage generated by the voltage generator 150 to the selected word line among the selected memory blocks, and applies the pass voltage Vpass to the other unselected word lines.

The address decoder 120 is configured to decode a column address in the received address. The address decoder 120 transmits the decoded column address to the read/write circuit 130.

Read and program operations of the semiconductor memory device 100 are performed in units of pages. An address received in a request of the read operation and the program operation includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation of the memory cell array 110, and operate as a "write circuit" in a write operation of the memory cell array 110. The page buffers PB1 to PBm are connected to the memory cell array 110 through the bit lines BL1 to BLm. In order to sense threshold voltages of memory cells in the read operation and the program verify operation, the page buffers PB1 to PBm sense a change in amount of current flowing depending on a program state of a corresponding memory cell while continuously supplying sensing current to bit lines connected to the memory cells, and latch the sensed change as sensing data. The read/write circuit 130 operates in response to page buffer control signals output from the control logic 140.

In the read operation, the read/write circuit 130 temporarily stores read data by sensing data of a memory cell and then outputs data DATA to the input/output buffer (not shown) of the semiconductor memory device 100. In an embodiment, the read/write circuit 130 may include a column selection circuit, and the like, in addition to the page buffers (or page registers).

The control logic 140 is connected to the address decoder 120, the read/write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. Also, the control logic 140 outputs a control signal for controlling sensing node precharge potential levels of the page buffers PB1 to PBm. The control logic 140 may control the read/write circuit 130 to perform the read operation of the memory cell array 110.

In the read operation, the voltage generator 150 generates the read voltage Vread and the pass voltage Vpass in response to a control signal output from the control logic 140. In order to generate a plurality of voltages having various voltage levels, the voltage generator 150 may include a plurality of pumping capacitors for receiving an internal power voltage, and generate a plurality of voltages by selectively activating the plurality of pumping capacitors under the control of the control logic 140.

The address decoder 120, the read/write circuit 130, and the voltage generator 150 may serve as a "peripheral circuit" that performs a read operation, a write operation, and an erase operation on the memory cell array 110. The peripheral circuit performs the read operation, the write operation, and the erase operation on the memory cell array 110 under the control of the control logic 140.

Figure 3:
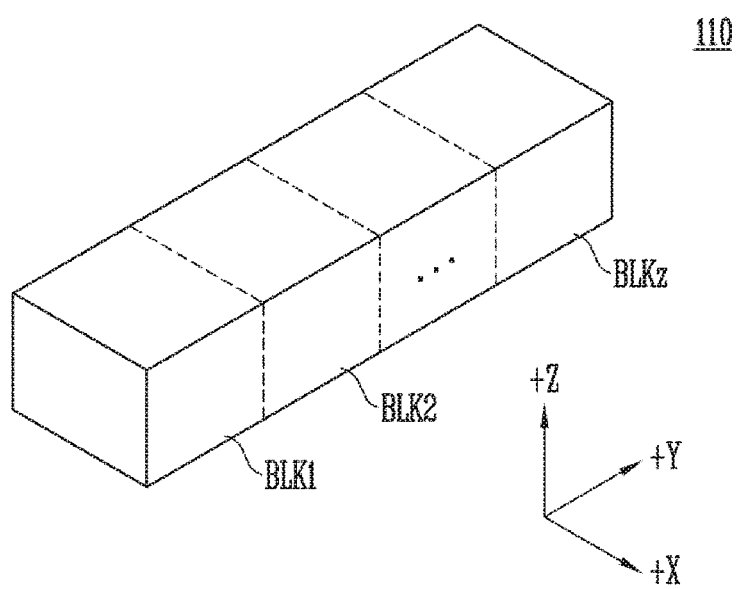
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block has a three-dimensional structure. Each memory block includes a plurality of memory cells stacked above a substrate. The memory cells are arranged with dimensions extending along +X, +Y, and +Z directions. The structure of each memory block will be described in more detail with reference to FIGS. 4 and 5.

Figure 4:
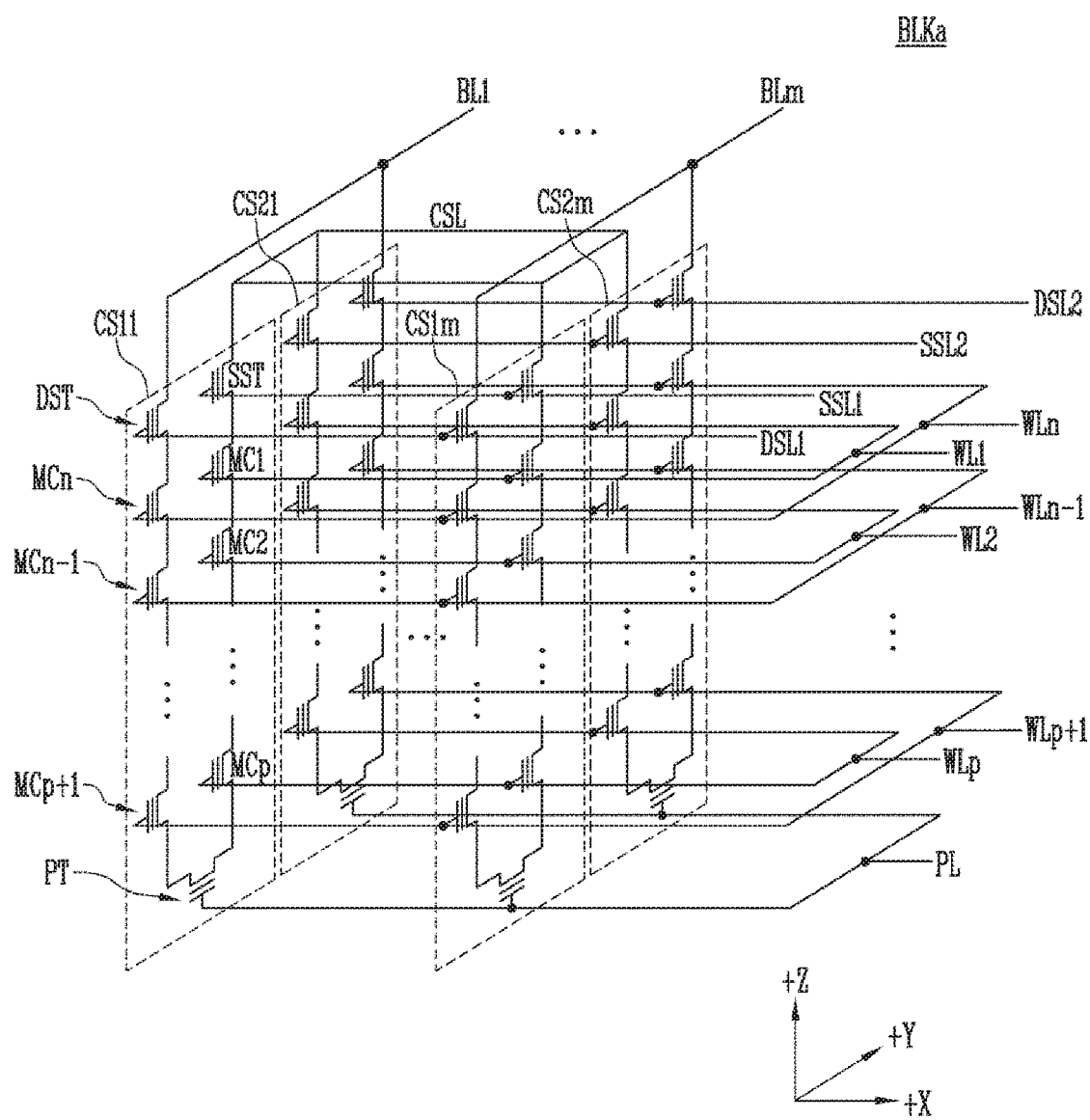
FIG. 4 is a circuit diagram illustrating an example of any one memory block among memory blocks of FIG. 3.

FIG. 4 is a circuit diagram illustrating an example of any one memory block BLKa among the memory blocks BLK1 to BLKz of FIG. 3.

Referring to FIG. 4, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e., a +X direction). In FIG. 4, it is illustrated that two cell strings are arranged in a column direction (i.e., a +Y direction). However, this is for clarity; three cell strings may be arranged in the column direction.

Each of the cell strings CS11 to CS1m and CS21 to CS2m includes at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 4, the source select transistors of the cell strings CS11 to CS1m on a first row are connected to a first source select line SSL1. The source select transistors of the cell strings CS21 to CS2m on a second row are connected to a second source select line SSL2.

In another embodiment, the source select transistors of the cell strings CS11 to CS1m and CS21 to CS2m may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp are sequentially arranged in a −Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the column direction are connected to a bit line extending in the column direction. In FIG. 4, the cell strings CS11 and CS21 on a first column are connected to a first bit line BL1. The cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. When any one of the drain select lines DSL1 and DSL2 is selected, cell strings arranged in one row direction may be selected. When any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells may be controlled by a voltage applied to the dummy word lines connected to the respective dummy memory cells, so that the dummy memory cells can have the required threshold voltage.

Figure 5:
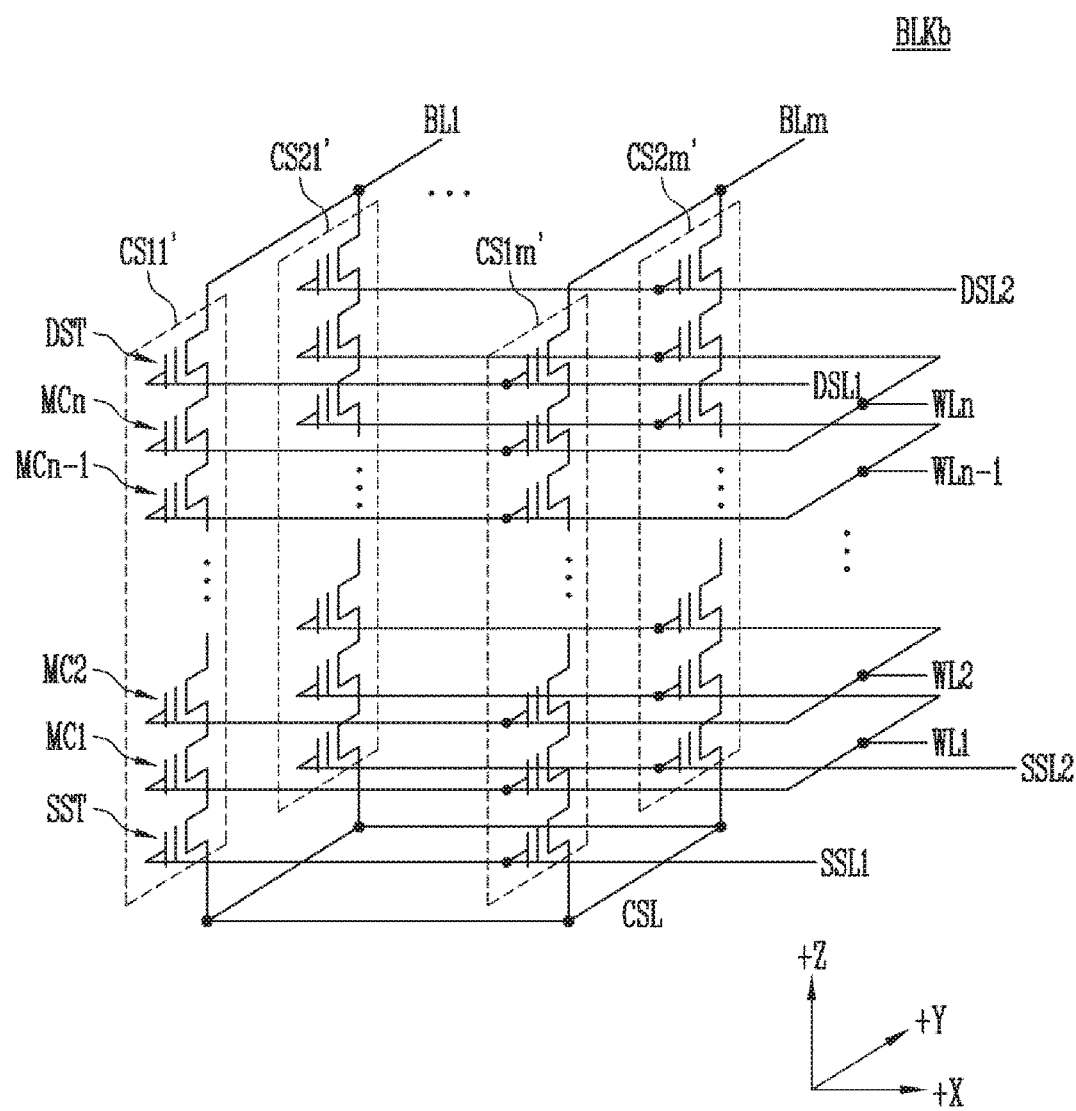
FIG. 5 is a circuit diagram illustrating another embodiment of the one memory block among the memory blocks of FIG. 3.

FIG. 5 is a circuit diagram illustrating another embodiment BLKb of the one memory block among the memory blocks BLK1 to BLKz of FIG. 3.

Referring to FIG. 5, the memory block BLKb includes a plurality of cell strings CS11' to CS1m' and CS21' to CS2m'. Each of the cell strings CS11' to CS1m' and CS21' to CS2m' extends along the +Z direction. Each of the cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

In summary, the memory block BLKb of FIG. 5 has a circuit similar to that of the memory block BLKa of FIG. 4. That is, the pipe transistor PT included in each cell string in the memory block BLKa of FIG. 4 may be excluded in the memory block BLKb of FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCn. Alternatively, the dummy memory cell(s) may be provided to decrease an electric field between the drain select transistor DST and the memory cells MC1 to MCn. When the number of dummy memory cells increases, the reliability of an operation of the memory block BLKb is improved. On the other hand, the size of the memory block BLKb increases. When the number of dummy memory cells decreases, the size of the memory block BLKb decreases. On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
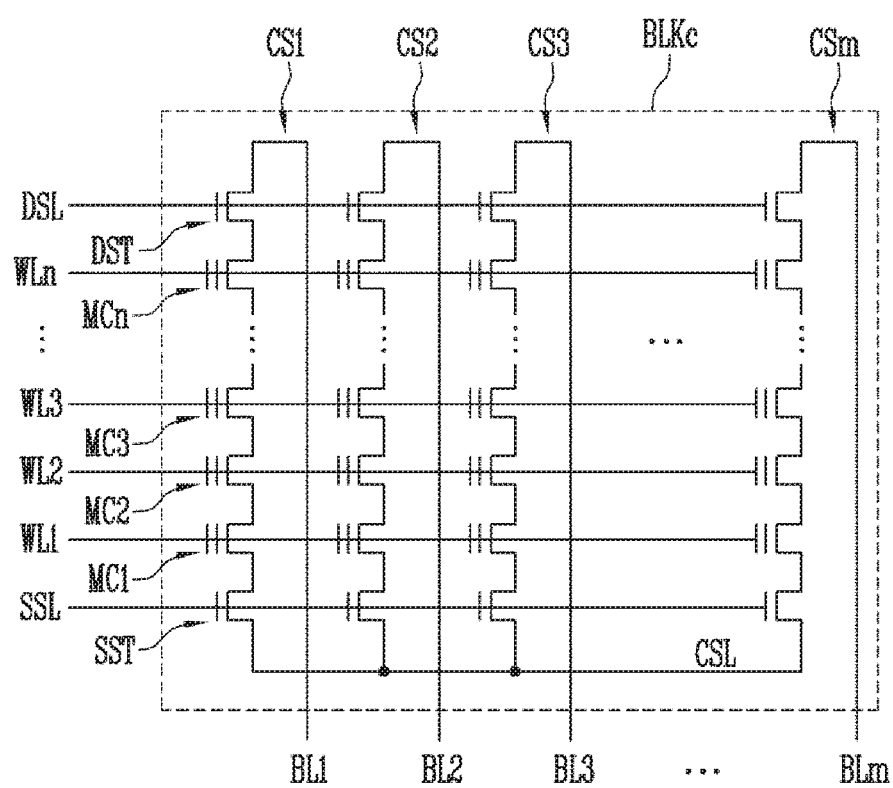
FIG. 6 is a circuit diagram illustrating an embodiment of any one memory block among a plurality of memory blocks included in the memory cell array of FIG. 2.

FIG. 6 is a circuit diagram illustrating an embodiment of any one memory block BLKc among the plurality of memory blocks in the memory cell array 110 of FIG. 2.

Referring to FIG. 6, the memory block BLKc includes a plurality of strings CS1 to CSm. The strings CS1 to CSm may be connected to a plurality of bit lines BL1 to BLm, respectively. Each of the plurality of strings CS1 to CSm includes at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCn.

The first to nth memory cells MC1 to MCn of each cell string is connected between the source select transistor SST and the drain select transistor DST.

The drain select transistor DST of each cell string is connected between a corresponding bit line and the memory cells MC1 to MCn.

Memory cells connected to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm may be connected to the even bit lines, respectively, and odd-numbered cell strings among the cell strings CS1 to CSm may be connected to the odd bit lines, respectively.

As shown in FIGS. 3 to 5, the memory cell array 110 of the memory device 100 may be configured as a three-dimensional structure. In addition, as shown in FIG. 6, the memory cell array 110 of the memory device 100 may be configured as a two-dimensional structure.

Figure 7:
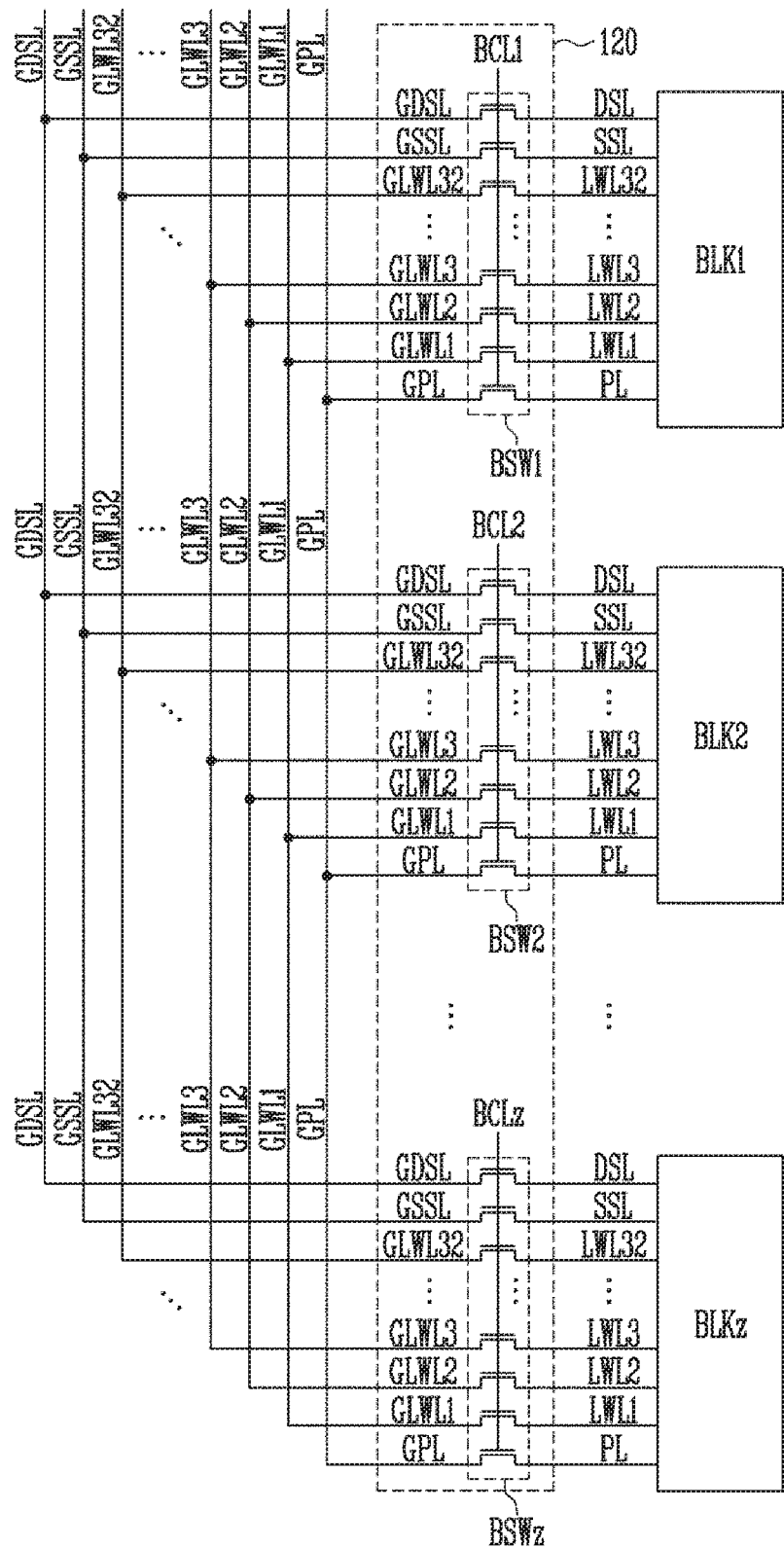
FIG. 7 is a block diagram illustrating an exemplary address decoder of FIG. 2.

FIG. 7 is a block diagram illustrating an exemplary address decoder 120 of FIG. 2.

Referring to FIG. 7, global lines GL includes a global drain select line GDSL, a global source select line GSSL, global word lines GWL1 to GWL32, and a global pipe line GPL, and voltages having various levels, which are generated by the voltage generator 150, are transferred to the global lines GL.

The address decoder 120 includes block select circuits BSW1 to BSWz, and the block select circuits BSW1 to BSWz may be respectively connected to corresponding memory blocks BLK1 to BLKz.

The address decoder 120 transfers voltages applied to the global lines GL to local lines DSL, SSL, LWL1 to LWL32, and PL of a selected memory block in response to a block select signal BCL1 to BCLz.

Specifically, each of the block select circuits BSW1 to BSWz included in the address decoder 120 connects the global lines GL and the local lines DSL, SSL, LWL1 to LWL32, and PL in response to the block select signal BCL1 to BCLz such that the voltages applied to the global lines GL are transferred to the local lines DSL, SSL, LWL1 to LWL32, and PL.

For example, when z (z is a positive integer) memory blocks are included in the memory cell array 110, the address decoder 120 includes z block select circuits BSW1 to BSWz. In an erase operation, a block select circuit connected to a selected memory block to be erased is turned on, so that the global lines GL and the local lines DSL, SSL, LWL1 to LWL32, and PL are connected. A block select circuit connected to an unselected memory block not to be erased may be turned off.

Figure 8:
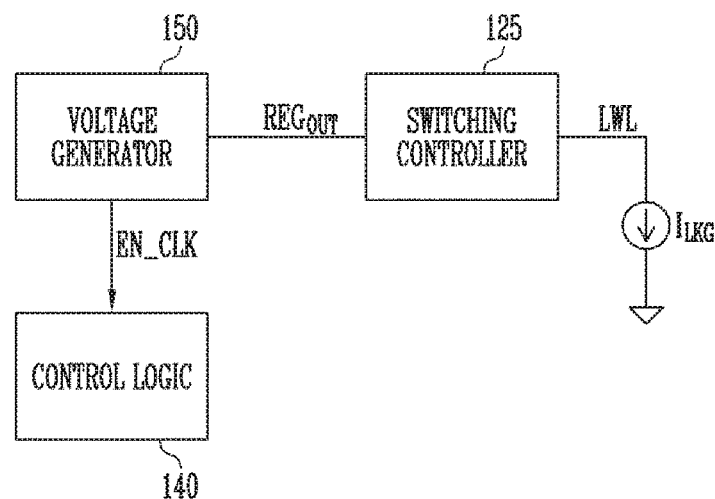
FIG. 8 is a block diagram illustrating leakage current detection of the semiconductor memory device according to an embodiment of the present disclosure.

FIG. 8 is a block diagram illustrating leakage current detection of the semiconductor memory device 100 according to an embodiment of the present disclosure.

Referring to FIG. 8, the voltage generator 150, the control logic 140, and a switching controller 125 of the semiconductor memory device 100 are illustrated. For clarity, only components of the semiconductor memory device 100 relevant to the features described here are illustrated in FIG. 8. In an embodiment of the present disclosure, the voltage generator 150, the control logic 140, and the switching controller 125 may operate as a leakage current detector for detecting a leakage current of a local word line LWL.

The switching controller 125 may be configured as a switching circuit for selectively connecting an output terminal of the voltage generator 150 and the local word line LWL. A portion of the switching controller 125 may operate as the address decoder 120. For example, the switching controller 125 may include a plurality of switching circuits, some of the plurality of switching circuits may operate as at least one of the block select circuits BSW1 to BSWz shown in FIG. 7. The block select circuits BSW1 to BSWz may selectively connect a global word line GWL to a local word line LWL, based on a block select signal. A leakage current may flow in a local word line LWL of a specific memory block. In FIG. 8, the leakage current flowing in the local word line LWL is illustrated as a current source having a current value $I_{LKG}$.

When a leakage current excessively flows in a local word line LWL, a memory block connected to the corresponding local word line LWL may not be used. The memory block connected to the local word line LWL through which the excessive leakage current flows may be determined as a bad block. Therefore, the leakage current of the local word line LWL is detected so as to determine whether the memory block is a bad block.

As a method for detecting a leakage current, a number of input clock signals EN_CLK input to a charge pump of the voltage generator 150 may be counted. The method for detecting the leakage current, based on the number of input clock signals EN_CLK input to the charge pump, will be described in more detail with reference to FIGS. 9 to 13B.

Figure 9:
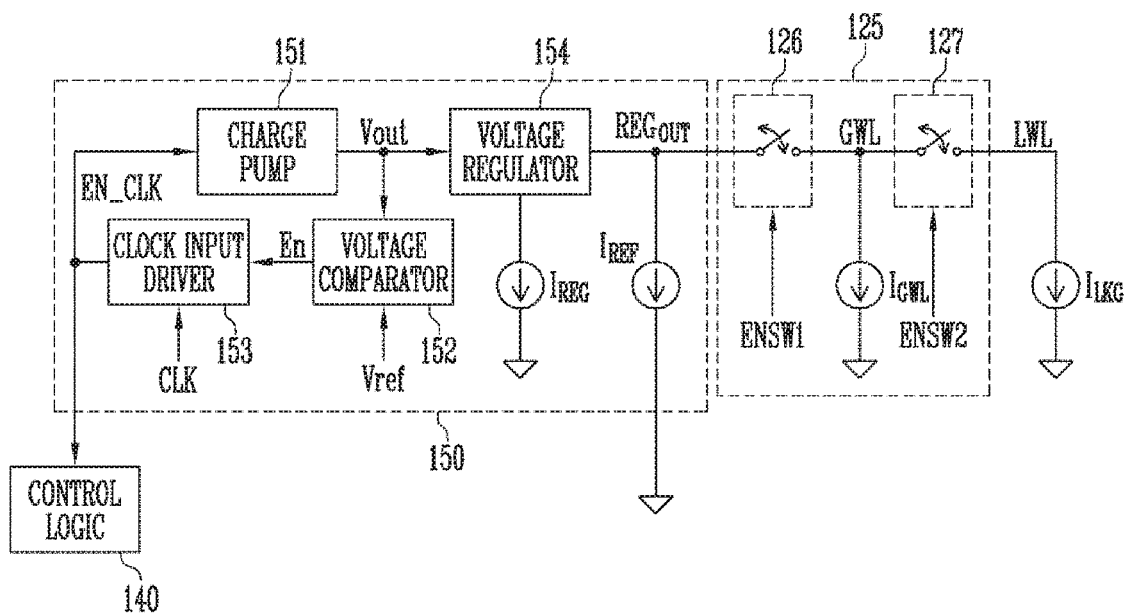
FIG. 9 is a block diagram illustrating an exemplary voltage generator of FIG. 8.

FIG. 9 is a block diagram illustrating in more detail the voltage generator 150 and the switching controller 125 of FIG. 8.

Referring to FIG. 9, the voltage generator 150 includes a charge pump 151, a voltage comparator 152, a clock input driver 153, and a voltage regulator 154. In addition, the switch controller 125 includes a first switch circuit 126 and a second switching circuit 127.

The charge pump 151 is a circuit for generating a high output voltage Vout, using a low input voltage. The charge pump 151 may be configured in various forms. For example, the charge pump 151 may be a Dickson charge pump configured with a plurality of diodes and capacitors. The Dickson charge pump may generate the high output voltage Vout by pumping an input clock signal EN_CLK using the plurality of diodes and capacitors.

The voltage comparator 152 generates an enable signal En by comparing the output voltage Vout with a reference voltage Vref. The clock input driver 153 generates the input clock signal EN_CLK by receiving the enable signal En and an external clock signal CLK.

For example, when the output voltage Vout is lower than the reference voltage Vref, the enable signal EN may maintain a high state. The enable signal En in the high state is applied to the clock input driver 153. While the enable signal En is in the high state, the clock input driver 153 applies the external clock signal CLK as the input clock signal EN_CLK to the charge pump 151. The charge pump 151 continuously increases the output voltage Vout.

When the output voltage Vout is higher than the reference voltage Vref, the enable signal En may maintain a low state. The enable signal En in the low state is applied to the clock input driver 153. While the enable signal En is in the low state, the clock input driver 153 applies the input clock signal EN_CLK in the low state to the charge pump 151. The charge pump 151 does not increase the output voltage Vout.

The voltage regulator 154 may generate a regulating voltage $REG_{OUT}$ by regulating the output voltage Vout of the charge pump 151.

The first switching circuit 126 of the switching controller 125 may selectively connect an output terminal of the voltage regulator 154 to the global word line GWL, based on a first switching enable signal ENSW1. For example, when the first switching enable signal ENSW1 is enabled, the first switching circuit 126 may connect the output terminal of the voltage regulator 154 to the global word line GWL. When the first switching enable signal ENSW1 is disabled, the first switching circuit 126 may disconnect the output terminal of the voltage regulator 154 from the global word line GWL.

The second switching circuit 127 of the switching controller 125 may connect the global word line GWL to the local word line LWL, based on a second switching enable signal ENSW2. For example, when the second switching enable signal ENSW2 is enabled, the second switching circuit 127 may connect the global word line GWL to the local word line LWL. When the second switching enable signal ENSW2 is disabled, the second switching circuit 127 may disconnect the global word line GWL from the local word line LWL. As described above, the second switching circuit 127 shown in FIG. 9 may be any one of the block select circuits BSW1 to BSWz of the address decoder 120 shown in FIG. 7.

Referring to FIG. 9, a leakage current $I_{REG}$ flowing from the voltage regulator 154, a leakage current $I_{GWL}$ of the global word line GWL, and a leakage current $I_{LKG}$ of the local word line LWL are illustrated. Among these leakage currents, the leakage current $I_{LKG}$ of the local word line LWL is to be detected so as to determine whether a memory block is a bad block. The semiconductor memory device 100, according to an embodiment of the present disclosure, detects the leakage current $I_{LKG}$ of the local word line LWL, using a reference current $I_{REF}$ connected to the output terminal of the voltage regulator 154.

The clock input driver 153 also outputs the input clock signal EN_CLK to the control logic 140. The control logic 140 calculates a leakage current flowing from an output terminal of the charge pump 151, based on the received input clock signal EN_CLK.

Figure 10:
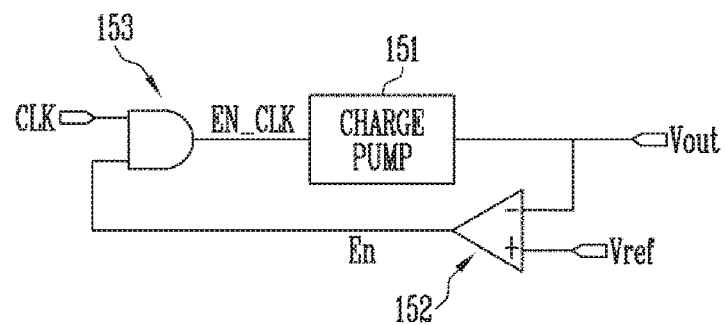
FIG. 10 is a circuit diagram illustrating an exemplary configuration of a voltage comparator and a clock input driver, which are shown in FIG. 9.

FIG. 10 is a circuit diagram illustrating an exemplary configuration of the charge pump 151, the voltage comparator 152 and the clock input driver 153, which are shown in FIG. 9.

Referring to FIG. 10, the voltage comparator 152 of FIG. 9 may be configured with a comparator, and the clock input driver 153 of FIG. 9 may be configured with an AND gate. The comparator generates the enable signal En by comparing the output voltage Vout of the charge pump 151 with the reference voltage Vref. When the output voltage Vout of the charge pump 151 is less than the reference voltage Vref, the enable signal En maintains the high state. When the output voltage Vout of the charge pump 151 is greater than the reference voltage Vref, the enable signal En maintains the low state. That is, the enable signal En is enabled when the output voltage Vout of the charge pump 151 is less than the reference voltage Vref.

The AND gate may generate the input clock signal EN_CLK by performing a logical AND operation on the external clock signal CLK and the enable signal En. Accordingly, when the enable signal En is in the high state, the AND gate outputs the external clock signal CLK as the input clock signal EN_CLK. When the enable signal En is in the low state, the AND gate outputs the input clock signal EN_CLK in the low state.

Thus, when the output voltage Vout of the charge pump 151 is smaller than the reference voltage Vref, the AND gate outputs the external clock signal CLK as the input clock signal EN_CLK. Accordingly, the charge pump 151 increases the output voltage Vout.

Also, when the output voltage Vout of the charge pump 151 is greater than the reference voltage Vref, the AND gate outputs the input clock signal EN_CLK in the low state. Accordingly, the charge pump 151 does not increase the output voltage Vout.

Figure 11:
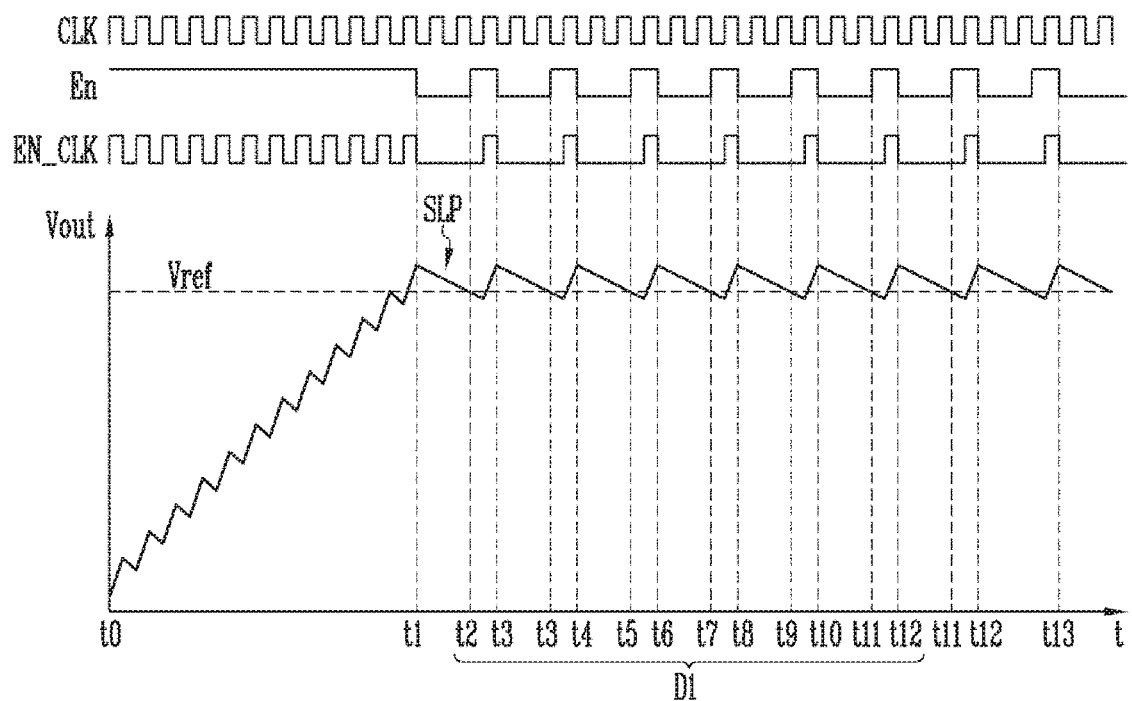
FIG. 11 is a timing diagram illustrating an exemplary operation of the voltage generator shown in FIGS. 9 and 10.

FIG. 11 is a timing diagram illustrating an exemplary operation of the voltage generator 150 shown in FIGS. 9 and 10.

Referring to FIG. 11, the external clock signal CLK, the enable signal En, the input clock signal EN_CLK, and the output voltage Vout of the charge pump 151 are illustrated along the axis of time "t". In FIG. 11, an example in which the charge pump 151 is implemented as a Dickson charge pump will be described.

During a period t0 to t1, the magnitude of the output voltage Vout is less than the reference voltage Vref. Therefore, during the period t0 to t1, the voltage comparator 152 may output the enable signal En in the high state. The clock input driver 153 may perform a logical AND operation on the enable signal En in the high state and the external clock signal CLK. Accordingly, the input clock signal EN_CLK, identical to the external clock signal CLK, is output. The charge pump 151 increases the output voltage Vout in synchronization with a clock period of the input clock signal EN_CLK.

Since the output voltage Vout is greater than the reference voltage at a time t1, the voltage comparator 152 may output the enable signal in the low state. The clock input driver 153 may perform a logical AND operation on the enable signal En in the low state and the external clock signal CLK. Accordingly, the input clock signal EN_CLK in the low state is output. Since the charge pump 151 receives the input clock signal EN_CLK in the low state, the charge pump 151 no longer increases the output voltage Vout.

When a leakage current flows from the output terminal of the charge pump 151 shown in FIG. 9, the output voltage Vout is gradually decreased. Accordingly, the output voltage Vout is gradually decreased during a period t1 to t2. The speed at which the output voltage Vout is decreased may be in proportion to the magnitude of the leakage current flowing from the output terminal of the charge pump 151. Therefore, the slope SLP of the output voltage Vout during the period t1 to t2 changes based on the magnitude of the leakage current flowing from the output terminal of the charge pump 151. For example, when the magnitude of the leakage current flowing from the output terminal of the charge pump 151 is large, the slope SLP during the period t1 to t2 may be steep. When the magnitude of the leakage current flowing from the output terminal of the charge pump 151 is small, the slope SLP during the period t1 to t2 may be gentle.

At a time t2, the output voltage Vout is less than the reference voltage Vref. Accordingly, at the time t2, the state of the enable signal En is changed to the high state. During a period t2 to t3 in which the enable signal En is in the high state, the external clock signal CLK is input as the input clock signal EN_CLK to the charge pump 151. Thus, the charge pump 151 increases the output voltage Vout, based on the input clock signal EN_CLK.

By repeating the above-described procedure, the charge pump 151 of the voltage generator 150 may generate an output voltage having a value at or about the reference voltage Vref. The generated output voltage Vout may be regulated by the voltage regulator 154.

As described above, the slope SLP of the output voltage Vout during the period t1 to t2 is determined by the magnitude of the leakage current flowing from the output terminal of the charge pump 151. When the leakage current flowing from the output terminal of the charge pump 151 is large, the slope SLP with which the output voltage Vout is decreased may be steep. When the magnitude of the leakage current flowing from the output terminal of the charge pump 151 is small, the slope SLP with which the output voltage Vout is decreased may be gentle.

When the slope SLP is steep, the output voltage Vout is more frequently less than the reference voltage Vref. That is, the period of the enable signal En is shortened when the slope SLP is steep. Therefore, the period of the input clock signal EN_CLK may also be shortened. Consequently, as the magnitude of the leakage current flowing from the output terminal of the charge pump 151 increases, the period of the input clock signal EN_CLK shortens.

On the contrary, when the slope SLP is gentle, the output voltage Vout is less frequently less than the reference voltage Vref. That is, the period of the enable signal En is lengthened when the slope SLP is gentle. Therefore, the period of the input clock signal EN_CLK may also be lengthened. Consequently, as the magnitude of the leakage current flowing from the output terminal of the charge pump 151 decreases, the period of the input clock signal EN_CLK lengthens.

Thus, a relative magnitude of the leakage current flowing from the output terminal of the charge pump 151 can be determined through a period or frequency of the input clock signal EN_CLK, which is detected during a specific period (e.g., D1 shown in FIG. 11). When the number of oscillations, periods or pulses of the input clock signal EN_CLK, detected during the period D1, is large, the magnitude of the leakage current flowing from the output terminal of the charge pump 151 is determined to be large. When the number oscillations, periods or pulses of the input clock signal EN_CLK, detected during the period D1, is small, the magnitude of the leakage current flowing from the output terminal of the charge pump 151 is determined to be small. In FIG. 11, the number pulses of the input clock signal EN_CLK during the period D1 is 6. Throughout the specification, the phrase "clock number" refers to the number of oscillations, periods or pulses of the stated clock signal.

Figure 13A:
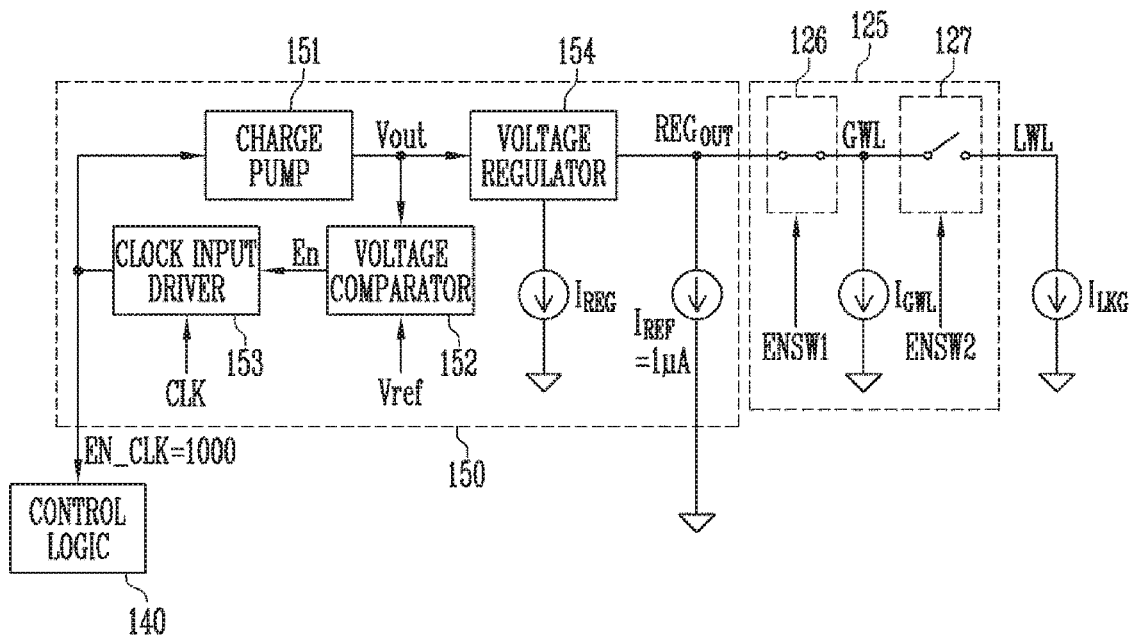
FIGS. 13A and 13B are diagrams illustrating the method shown in FIG. 12 according to an embodiment of the present disclosure.
Figure 13B:
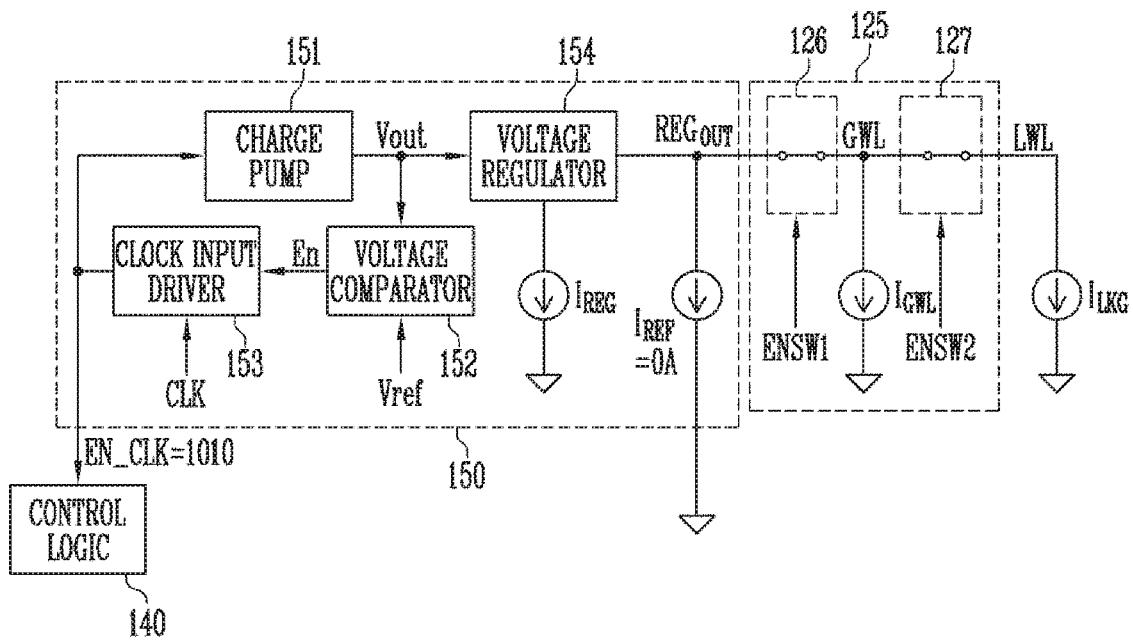

FIG. 12 is a flowchart illustrating a method for detecting a leakage current in the semiconductor memory device 100 according to an embodiment of the present disclosure. FIGS. 13A and 13B are diagrams illustrating the method shown in FIG. 12. A method according to an embodiment of the present disclosure will be described with reference to FIGS. 12, 13A, and 13B.

Referring to FIG. 12, a method for detecting the leakage current $I_{LKG}$ of the local word line LWL is illustrated based on the method described with reference to FIGS. 9 to 11.

First, a number of oscillations, periods or pulses of the input clock signal EN_CLK input to the charge pump 151 during a measurement period is counted using the reference current $I_{REF}$ (reference clock number) at step S110. Referring to FIG. 13A, in order to perform the step S110, the first switching circuit 126 is closed and the second switching circuit 127 is opened. That is, the first switching control signal ENSW1 is enabled and the second switching control signal ENSW2 is disabled. Accordingly, as shown in FIG. 13A, the output terminal of the voltage regulator 154 is connected to the global word line GWL, but the global word line GWL is disconnected from the local word line LWL.

In an example, the value of the reference current $I_{REF}$ is 1 micro ampere (μA) in FIG. 13A. The leakage current flowing from the output terminal of the charge pump 151 is a sum of a leakage current $I_{REG}$ of the voltage regulator 154, an intentionally applied reference current $I_{REF}$, and a leakage current $I_{GWL}$ of the global word line GWL.

The measurement period may be the period D1 shown in FIG. 11. As described above, when the number of oscillations, periods or pulses of the input clock signal EN_CLK (clock number) within the measurement period D1 increases, the magnitude of the leakage current flowing from the output terminal of the charge pump 151 is regarded as large.

In FIG. 13A, a situation in which the reference clock number of the input clock signal EN_CLK input to the charge pump 151 during the measurement period D1 is counted as 1000 when the value of the reference current $I_{REF}$ is 1 μA will be described as an example. That is, the reference clock number of the input clock signal EN_CLK counted in the step S110 of FIG. 12 is "1000." Specifically, the control logic 140 receives the input clock signal EN_CLK to count the reference clock number.

After the step S110 is performed, a number of oscillations or pulses of the input clock signal EN_CLK (target clock number) input to the charge pump 151 during the measurement period is counted using a leakage current of a word line of a target memory block at step S130.

Referring to FIG. 13B, in order to perform the step S130, the first switching circuit 126 is closed, and the second switching circuit 127 is also closed. That is, both the first and second switching control signals ENSW1 and ENSW2 are enabled. The reference current $I_{REF}$ is set not to flow. The leakage current flowing from the output terminal of the charge pump 151 is a sum of the leakage current $I_{REG}$ of the voltage regulator 154, the leakage current $I_{GWL}$ of the global word line GWL, and the leakage current $I_{LKG}$ of the local word line LWL.

In FIG. 13B, a situation in which the target clock number of the input clock signal EN_CLK input to the charge pump 151 during the measurement period is counted as 1010 when the value of the reference current $I_{REF}$ is set to 0 and the local word line LWL is connected will be described as an example. That is, the target clock number counted in the step S130 of FIG. 12 is "1010." Specifically, the control logic 140 receives the input clock signal EN_CLK to count the target clock number.

When comparing FIGS. 13A and 13B, in FIG. 13A, the leakage current flowing from the output terminal of the charge pump 151 includes the leakage current $I_{REG}$ of the voltage regulator 154, the reference current $I_{REF}$, and the leakage current $I_{GWL}$ of the global word line GWL. In FIG. 13B, the leakage current flowing from the output terminal of the charge pump 151 includes the leakage current $I_{REG}$ of the voltage regulator 154, the leakage current $I_{GWL}$ of the global word line GWL, and the leakage current $I_{LKG}$ of the local word line LWL. Assuming that the leakage current $I_{REG}$ of the voltage regulator 154 and the leakage current $I_{GWL}$ of the global word line GWL remain the same in both cases (FIGS. 13A and 13B), the reference clock number of the input clock signal EN_CLK input to the charge pump 151 in FIG. 13A may be determined by the reference current $I_{REF}$ of FIG. 13A, and the target clock number of the input clock signal EN_CLK input to the charge pump 151 in FIG. 13B may be determined by the leakage current $I_{LKG}$ of the local word line LWL of FIG. 13B.

In other words, when the reference clock number counted in the step S110 is greater than the target clock number counted in the step S130, the magnitude of the reference current $I_{REF}$ applied in FIG. 13A is determined to be larger than the leakage current $I_{LKG}$ of the local word line LWL connected by the second switching circuit 127 in FIG. 13B. On the contrary, when the reference clock number counted in the step S110 is smaller than the target clock number counted in the step S130, the magnitude of the reference current $I_{REF}$ applied in FIG. 13A is determined to be smaller than the leakage current $I_{LKG}$ of the local word line LWL connected by the second switching circuit 127 in FIG. 13B.

Therefore, the reference clock number measured in the step S110 may be compared with the target clock number measured in the step S130, and it may be determined based on the comparison result whether the magnitude of the leakage current $I_{LKG}$ of the local word line LWL is larger than the intentionally applied reference current $I_{REF}$. That is, in step S150, the control logic 140 determines whether the target clock number is greater than the reference clock number.

Referring to FIGS. 13A and 13B, the reference clock number is "1000" and the target clock number is "1010." As the determination result of the step S150, the control logic 140 determines that a target memory block connected to the corresponding local word line LWL is a bad block at step S170.

When the target clock number measured in FIG. 13B is "950" instead of "1010," the control logic 140 may not determine, as the determination result of the step S150, that the target memory block connected to the corresponding local word line LWL is the bad block.

As described above, based on a known reference current $I_{REF}$, it may be determined whether the leakage current $I_{LKG}$ of the local word line LWL is larger than the reference current $I_{REF}$.

However, according to the above-described method, the reference current $I_{REF}$ is to have a small value so as to detect an even smaller leakage current $I_{LKG}$. For example, the reference current $I_{REF}$ is to include a current source in a nano-ampere class so as to detect a leakage current of a nano-ampere (nA) smaller than the 1 μA shown in FIG. 13A. However, from a design viewpoint, it is not easy to implement such a fine and precise current source. Thus, a method for detecting a fine, e.g., small leakage current, using a relatively large current source, will be described with reference to FIGS. 15 to 16C.

Figure 14:
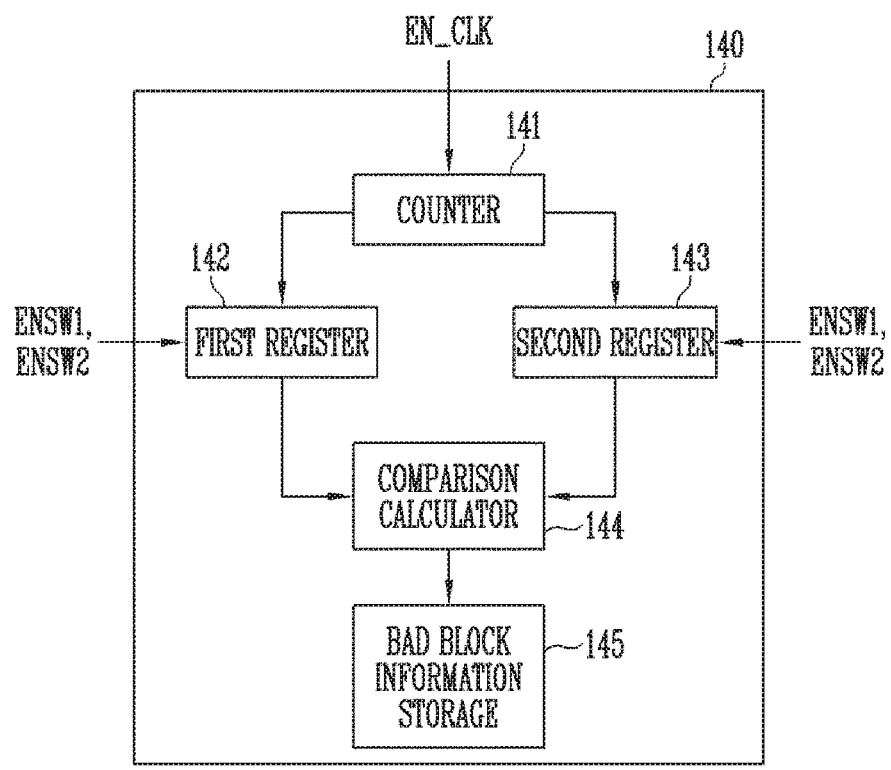
FIG. 14 is a block diagram illustrating an embodiment of a control logic shown in FIGS. 13A and 13B.

FIG. 14 is a block diagram illustrating an embodiment of the control logic 140 shown in FIGS. 13A and 13B.

Referring to FIG. 14, the control logic 140 includes a counter 141, a first register 142, a second register 143, a comparison calculator 144, and a bad block information storage 145.

Referring to FIGS. 13A, 13B and 14, the counter 141 may count the reference and target clock numbers of the input clock signal EN_CLK. The counter 141 may count the reference clock number from the input clock signal EN_CLK through the procedure shown in FIG. 13A and store the reference clock number in the first register 142. The first register 142 may store the reference clock number, based on the first and second switching control signals ENSW1 and ENSW2. That is, the first register 142 may store a value output from the counter 141 when the first switching control signal ENSW1 is enabled and the second switching control signal ENSW2 is disabled.

The counter 141 may count the target clock number from the input clock signal EN_CLK through the procedure shown in FIG. 13B and store the target clock number in the second register 143. The second register 143 may store the target clock number based on the first and second switching control signals ENSW1 and ENSW2. That is, the second register 143 may store a value output from the counter 141 when both the first and second switching control signals ENSW1 and ENSW2 are enabled.

The comparison calculator 144 compares the reference clock number stored in the first register 142 and the target clock number stored in the second register 143. The comparison calculator 144 stores bad block information indicating whether a corresponding memory block is a bad block in the bad block information storage 145, based on the comparison result. As shown in FIG. 12, when the target clock number is greater than the reference clock number, the target memory block may be determined as a bad block, and information corresponding thereto may be stored in the bad block information storage 145.

Figure 16A:
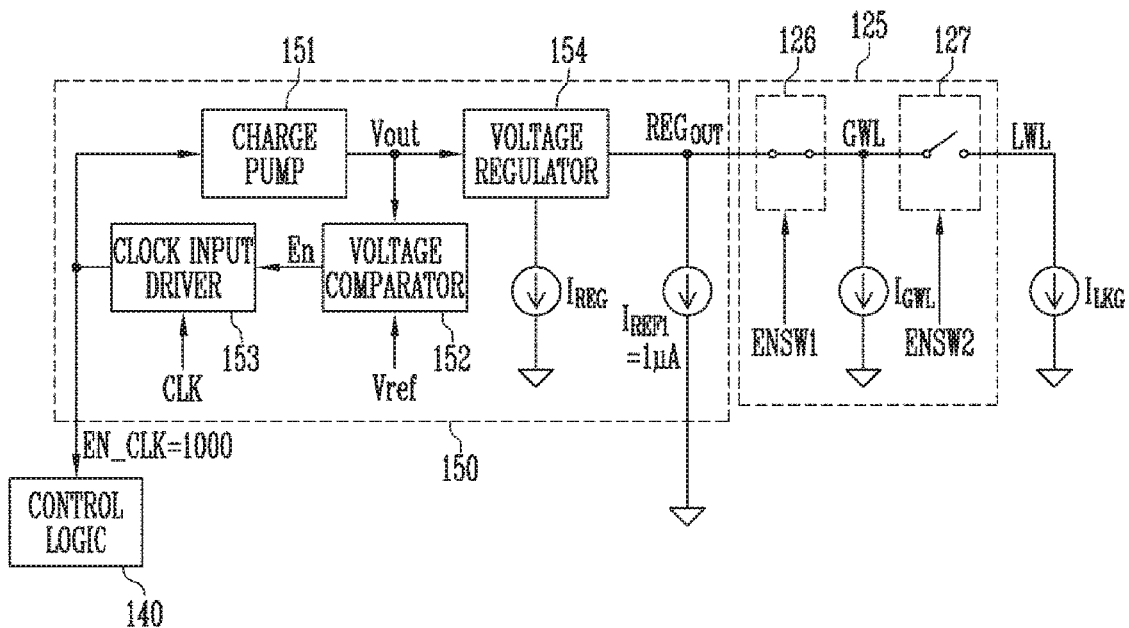
FIGS. 16A to 16C are diagrams illustrating the method shown in FIG. 15 according to an embodiment of the present disclosure.
Figure 16B:
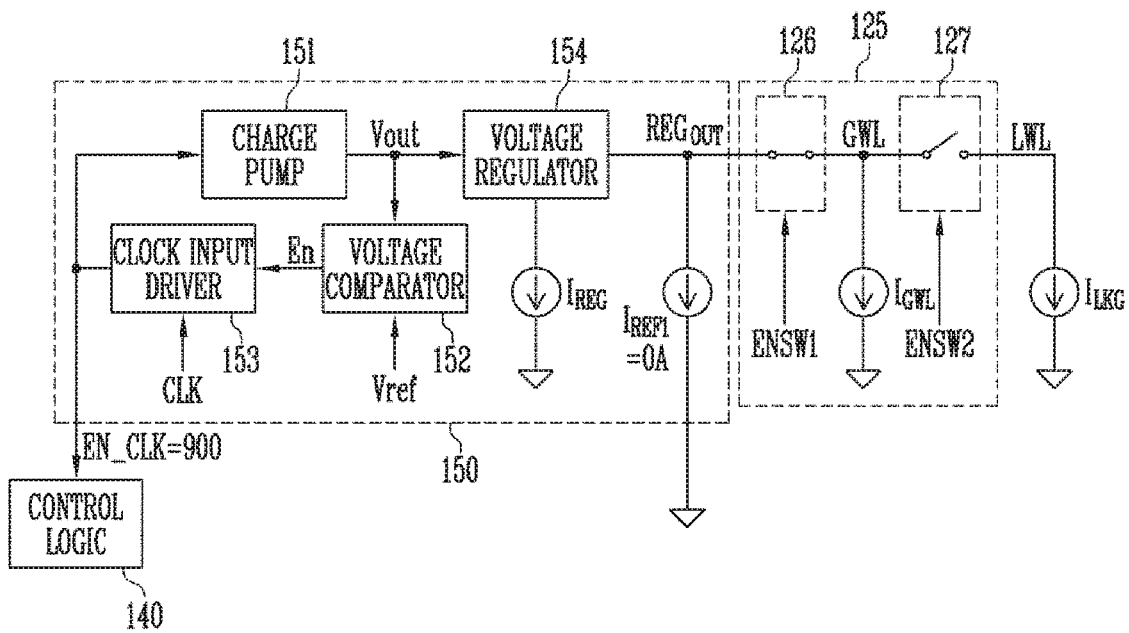
Figure 16C:
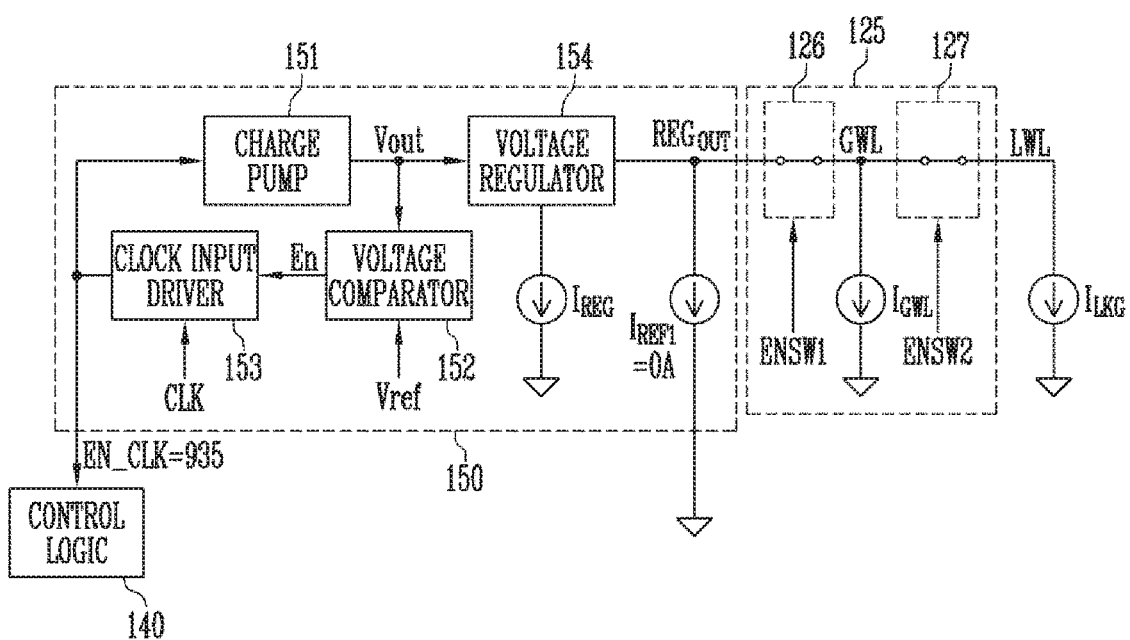

FIG. 15 is a flowchart illustrating a method for detecting a leakage current in the semiconductor memory device 100 according to another embodiment of the present disclosure. FIGS. 16A to 16C are diagrams illustrating the method shown in FIG. 15. A method according to another embodiment of the present disclosure will be described with reference to FIGS. 15, 16A, 16B, and 16C.

A number of oscillations or pulses of the input clock signal EN_CLK input to the charge pump 151 during a measurement period is counted using a first reference current $I_{REF1}$ (reference clock number) at step S210. Referring to FIG. 16A, in order to perform the step S210, the first switching control signal ENSW1 applied to the first switching circuit 126 is enabled, and the second switching control signal ENSW2 applied to the second switching circuit 127 is disabled. In an example, the value of the first reference voltage $I_{REF1}$ is 1 micro ampere (μA) in FIG. 16A. The leakage current flowing from the output terminal of the charge pump 151 is a sum of a leakage current $I_{REG}$ of the voltage regulator 154, an intentionally applied reference current $I_{REF}$ of 1 μA, and a leakage current $I_{GWL}$ of the global word line GWL.

The measurement period may be the period D1 shown in FIG. 11. As described above, when the number of oscillations or pulses, i.e., clock number, of the input clock signal EN_CLK within the measurement period D1 increases, the magnitude of the leakage current flowing from the output terminal of the charge pump 151 is determined to be large.

In FIG. 16A, a situation in which the first reference clock number of the input clock signal EN_CLK input to the charge pump 151 during the measurement period is counted as 1000 when the value of the first reference current $I_{REF1}$ is 1 μA will be described as an example. That is, the first reference clock number of the input clock signal EN_CLK counted in the step S210 of FIG. 15 is "1000." Specifically, the control logic 140 receives the input clock signal EN_CLK to count the first reference clock number.

After the step S210 is performed, a second reference clock number of the input clock signal EN_CLK input to the charge pump 151 during the measurement period is counted using a second reference current $I_{REF2}$ at step S220. Referring to FIG. 16B, in order to perform the step S220, the first switching control signal ENSW1 applied to the first switching circuit 126 is enabled, and the second switching control signal ENSW2 applied to the second switching circuit 127 is disabled. In an example, the value of the second reference voltage $I_{REF2}$ is 0 ampere (A) in FIG. 16B. The leakage current flowing from the output terminal of the charge pump 151 is a sum of the leakage current $I_{REG}$ of the voltage regulator 154, and the leakage current $I_{GWL}$ of the global word line GWL.

In FIG. 16B, a situation in which the second reference clock number input to the charge pump 151 during the measurement period is counted as 900 when the value of the second reference current $I_{REF2}$ is 0 A will be described as an example. That is, the second reference clock number of the input clock signal EN_CLK counted in the step S220 of FIG. is "900." Specifically, the control logic 140 receives the input clock signal EN_CLK to count the second reference clock number.

The second reference current $I_{REF2}$ of 0 A is merely illustrative, and it will be apparent that various other current values may be determined as the second reference current $I_{REF2}$.

Subsequently, in step S230, a third reference clock number of the input clock signal EN_CLK corresponding to a third reference current $I_{REF3}$ to be measured is calculated based on the first and second reference clock numbers. To this end, first, the third reference current $I_{REF3}$ to be compared with the leakage current $I_{LKG}$ of the local word line LWL is determined. In an example, it is required to determine whether the leakage current $I_{LKG}$ of the local word line LWL is larger than 300 nano ampere (nA) so as to detect a bad block. Therefore, 300 nA is determined as the third reference current $I_{REF3}$. The third reference current $I_{REF3}$ may be a small current that it is difficult to implement with a current source.

The first to third reference currents $I_{REF1}$ to $I_{REF3}$ and the first to third reference clock numbers respectively corresponding thereto may have a proportional relationship as shown in the following Expression 1.

$$(I_{REF1} - I_{REF2}):(I_{REF3} - I_{REF2}) = (CNT1 - CNT2):(CNT3 - CNT2) \quad \text{Expression 1}$$

$I_{REF3}$ is the third reference current to be compared, and CNT1 is the first reference clock number. In addition, CNT2 is the second reference clock number, and CNT3 is the third reference clock number. Expression 1 rearranged with respect to the third reference clock number is shown in the following Expression 2.

$$CNT3 = \frac{I_{REF3} - I_{REF2}}{I_{REF1} - I_{REF2}} \cdot (CNT1 - CNT2) + CNT2 \quad \text{Expression 2}$$

Since CNT1 is 1000, CNT2 is 900, $I_{REF1}$ is 1 µA, $I_{REF2}$ is 0 A, and $I_{REF3}$ is 300 nA, CNT3 that is the third reference clock number of the input clock signal EN_CLK becomes "930." The third reference clock number may be temporarily stored in the control logic 140.

Subsequently, in step S240, a target clock number of the input clock signal EN_CLK input to the charge pump 151 during the measurement period is counted using a leakage current of a word line of a target memory block. Referring to FIG. 16C, both the first and second switching control signals ENSW1 and ENSW2 respectively applied to the first and second switching circuits 126 and 127 are enabled so as to perform the step S240.

In FIG. 16C, a situation in which the target clock number of the input clock signal EN_CLK input to the charge pump 151 during the measurement period is counted as 935 when the local word line LWL is connected without applying the reference current $I_{REF}$ will be described as an example. That is, the target clock number counted in the step S240 of FIG. 15 is "935." Specifically, the control logic 140 receives the input clock signal EN_CLK to count the target clock number.

In step S250, the target clock number is compared with the third reference clock number. Referring to FIGS. 16A to 16C, the target clock number is 935, which is greater than 930 that is the third reference clock number. Therefore, step S260 is then performed. When the target clock number is greater than the third reference clock number, the leakage current of the word line is determined to be larger than 300 nA that is the third reference current $I_{REF3}$. Therefore, the target memory block is determined as a bad block at step S260.

When the target clock number counted in FIG. 16C is less than 930, the leakage current is determined to be less than 300 nA. Therefore, the target memory block is not determined as the bad block.

Figure 17:
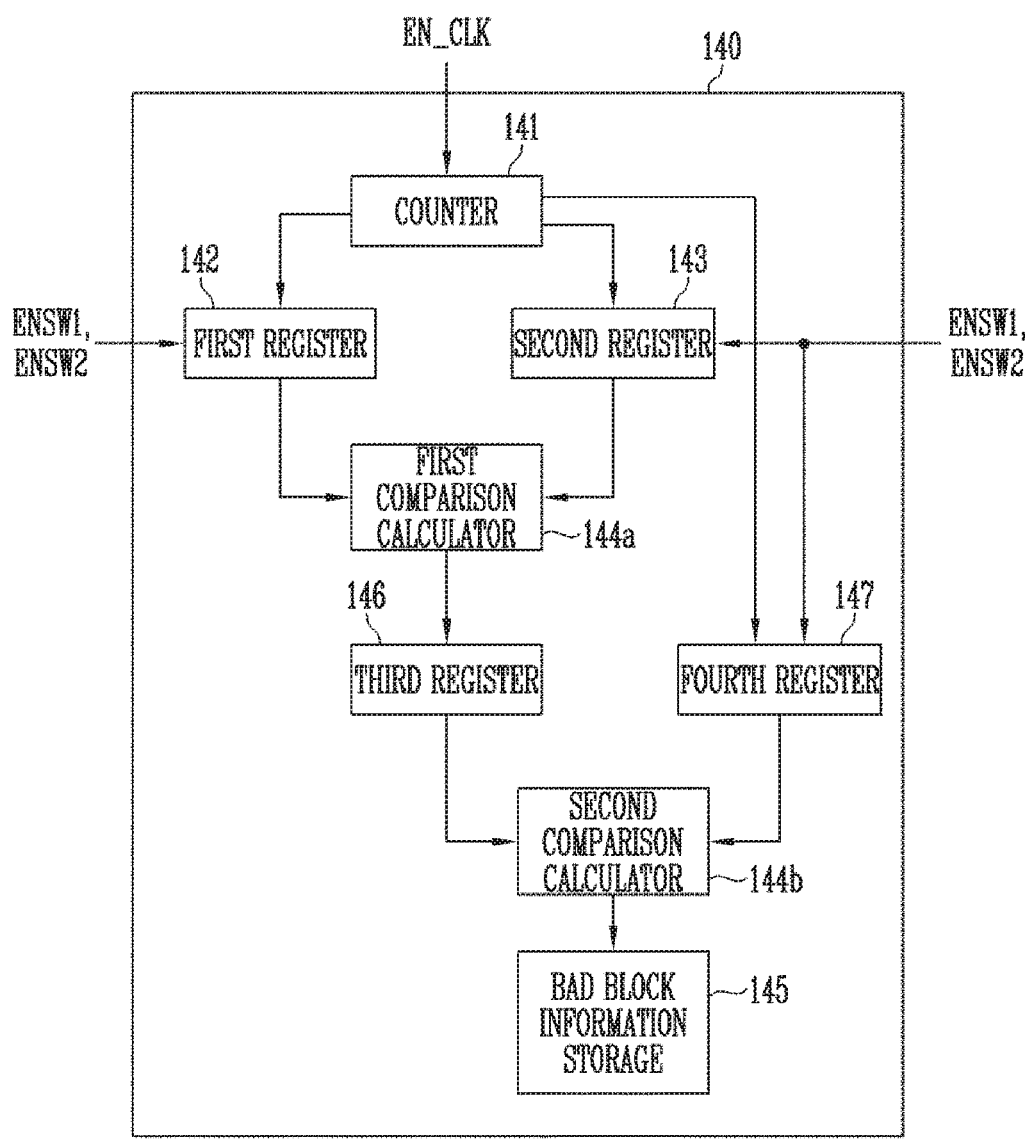
FIG. 17 is a block diagram illustrating an embodiment of the control logic shown in FIGS. 16A to 16C.

FIG. 17 is a block diagram illustrating an embodiment of the control logic 140 shown in FIGS. 16A to 16C.

Referring to FIG. 17, the control logic 140 includes a counter 141, a first register 142, a second register 143, a first comparison calculator 144a, a third register 146, a fourth register 147, a second comparison calculator 144b, and a bad block information storage 145.

Referring to FIGS. 16A to 16C and 17, the counter 141 may count a clock number of the input clock signal EN_CLK. The counter 141 may count a first reference clock number from the input clock signal EN_CLK output based on the first reference current $I_{REF1}$ through the procedure shown in FIG. 16A and store the first reference clock number in the first register 142. The first register 142 may store the first reference clock number, based on the first reference current $I_{REF1}$ and the first and second switching control signals ENSW1 and ENSW2. That is, the first register 142 may store a value output from the counter 141 when the first switching control signal ENSW1 is enabled and the second switching control signal ENSW2 is disabled in a state in which the reference current is 1 µA. The counter 141 may count a second reference clock number from the input clock signal EN_CLK through the procedure shown in FIG. 16B and store the second reference clock number in the second register 143. The second register 143 may store the second reference clock number, based on the reference current $I_{REF2}$ and the first and second switching control signals ENSW1 and ENSW2. That is, second register 143 may store a value output from the counter 141 when the first switching control signal ENSW1 is enabled and the second switching control signal ENSW2 is disabled in a state in which the reference current is 0 A.

The first comparison calculator 144a calculates a third reference clock number by comparing the first reference clock number stored in the first register 142 and the second reference clock number stored in the second register 143. As described above, the third reference clock number may be calculated based on the proportional expression shown in Expression 1. The calculated third reference clock number may be stored in the third register 146.

The counter 141 may count the target clock number from the input clock signal EN_CLK through the procedure shown in FIG. 16C and store the target clock number in the fourth register 147. The fourth register 147 may store the target clock number based on the first and second switching control signals ENSW1 and ENSW2. That is, the fourth register 147 may store a value output from the counter 141 when both the first and second switching control signals ENSW1 and ENSW2 are enabled.

The second comparison calculator 144b compares the third reference clock number stored in the third register 146 and the target clock number stored in the fourth register 147. Bad block information indicating whether a corresponding memory block is a bad block is stored in the bad block information storage 145, based on the comparison result of the second comparison calculator 144b. As shown in FIG. 15, when the target clock number is greater than the third reference clock number, the target memory block may be determined as a bad block, and information corresponding thereto may be stored in the bad block information storage 145.

Figure 18:
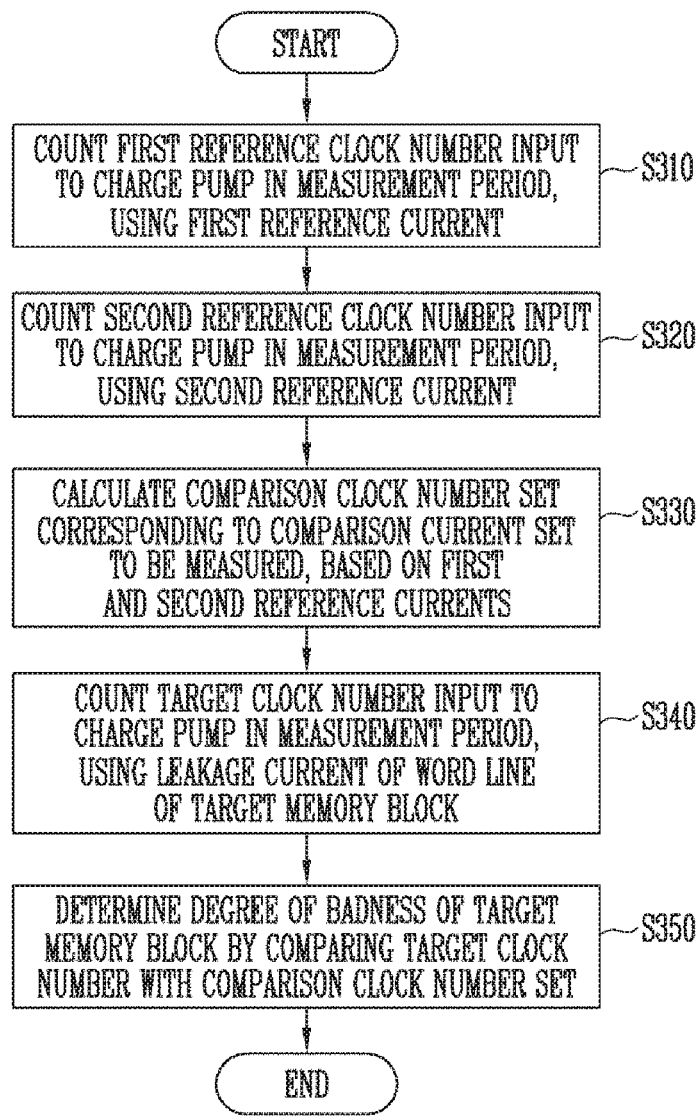
FIG. 18 is a flowchart illustrating a method for determining a degree of badness of a memory block according to still another embodiment of the present disclosure.

FIG. 18 is a flowchart illustrating a method for determining a degree of badness of a memory block according to still another embodiment of the present disclosure.

First, in step S310, a first reference clock number of the input clock signal EN_CLK input to the charge pump 151 in a measurement period is counted using the first reference current $I_{REF1}$. The step S310 may be substantially identical to the step S210 of FIG. 15. In step S320, a second reference clock number of the input clock signal EN_CLK input to the charge pump 151 is counted using the second reference current $I_{REF2}$. The step S320 may be substantially identical to the step S220 of FIG. 15.

In step S330, a comparison clock number set corresponding to a comparison current set to be measured is calculated, based on the first and second reference currents $I_{REF1}$ and $I_{REF2}$. The step S330 may be partially identical to the step S230 of FIG. 15. However, while only a third reference clock number corresponding to one third reference current $I_{REF3}$ is calculated in the step S230 of FIG. 15, comparison clock numbers corresponding to a plurality of comparison currents may be calculated in the step S330 of FIG. 18.

For example, as described with reference to FIGS. 15 to 17, the third reference clock number is determined with respect to the third reference current $I_{REF3}$ that is 300 nA in the step S230 of FIG. 15. A set of comparison clock numbers 920, 930, and 940 respectively corresponding to a set of comparison currents 200 nA, 300 nA, and 400 nA may be calculated in the step S330 of FIG. 18. In the above example, the comparison clock number set may include a first comparison clock number, a second comparison clock number, and a third comparison clock number. The first comparison clock number may be 920. The second comparison clock number may be 930. The third comparison clock number may be 940.

Subsequently, in step S340, a target clock number input to the charge pump 151 during the measurement period is counted using the leakage current of the word line of the target memory block. The step S340 may be substantially identical to the step S240 of FIG. 15.

Subsequently, in step S350, a degree of badness of the target memory block is determined by comparing the target clock number with the comparison clock number set calculated in the step S330. A detailed configuration of the step S350 will be described later with reference to FIG. 19.

Figure 19:
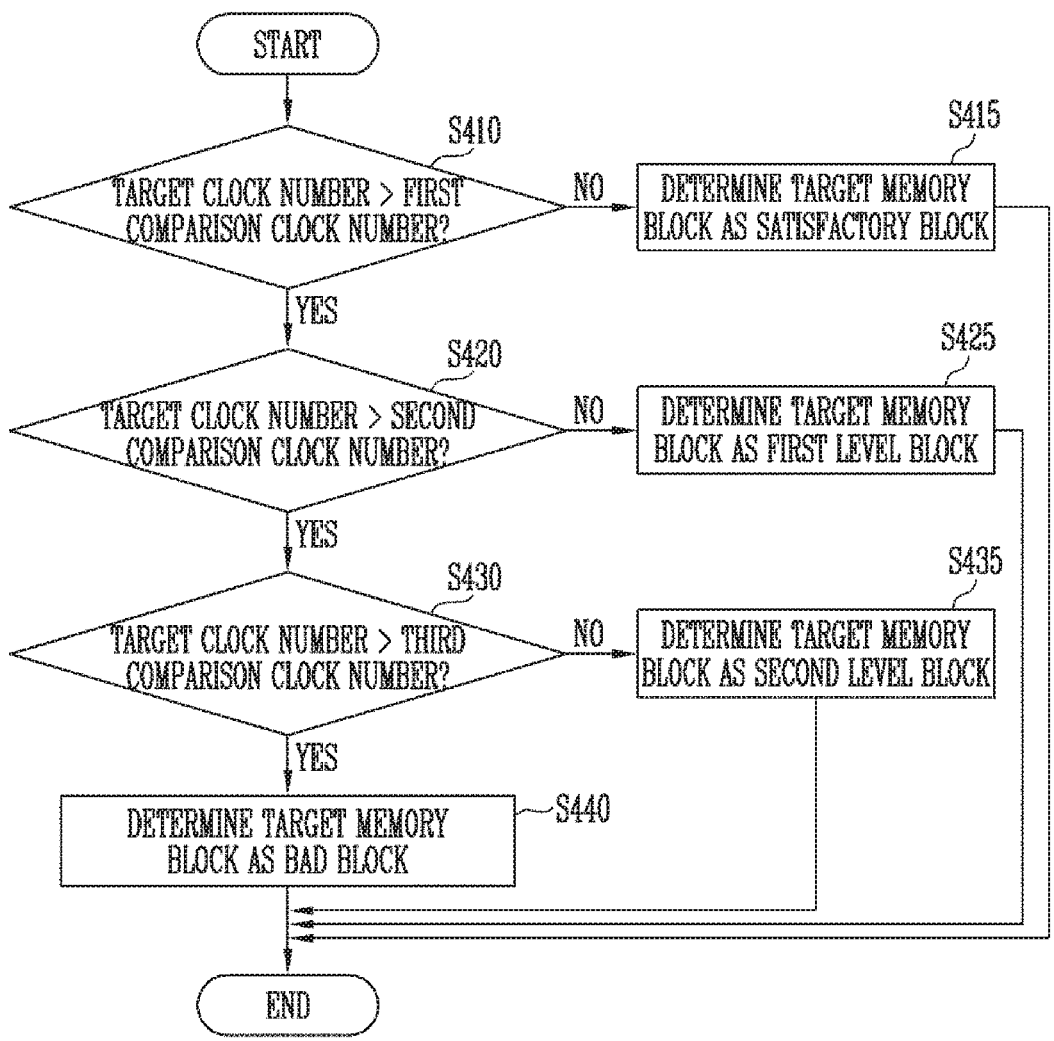
FIG. 19 is a flowchart illustrating exemplary operations of step S350 of FIG. 18.

FIG. 19 is a flowchart illustrating in detail the step S250 of FIG. 18. Like the above-described example, a case where the comparison clock number set includes the first comparison clock number, the second comparison clock number, and the third comparison clock number, and the first, second, and third comparison clock numbers are respectively 920, 930, and 940 will be described. The first to third comparison clock numbers may correspond to the first to third comparison currents.

Referring to FIG. 19, first, the target clock number is compared with the first comparison clock number at step S410. That is, it is determined whether the target clock number is greater than 920. When the target clock number is not greater than 920, the target memory block is determined as a satisfactory block at step S415.

When the target clock number is greater than 920, the target clock number is compared with the second comparison clock number at step S420. That is, it is determined whether the target clock number is greater than 930. When the target clock number is not greater than 930, the target memory block is determined as a first level block at step S425.

When the target clock number is greater than 930, the target clock number is compared with the third comparison clock number at step S430. That is, it is determined whether the target block number is greater than 940. When the target clock number is not greater than 940, the target memory block is determined as a second level block at step S435.

When the target clock number is greater than 940, the target memory block is determined as a bad block at step S440. According to the above-described manner, the target memory block may be determined as a bad block, a first level block, which indicates that the target memory block is approaching bad block status, or a second level block, which indicates that the target block is even closer to bad block status.

The comparative numbers used above with reference to FIG. 19 are examples. In another example, when the target clock number is 910, the target memory block is determined as a satisfactory block. In another example, when the target clock number is 925, the target memory block is determined as a first level memory block. In still another example, when the target clock number is 935, the target memory block is determined as a second level block. In still another example, when the target clock number is 945, the target memory block is determined as a bad block.

Accordingly, a memory block from which a leakage current larger than a comparison current is determined as a bad block. A memory block from which a leakage current close to the comparison current may be determined as a memory block having a first or second level. The memory block having the first or second level may be separately managed such that further degradation does not occur therein. For example, hot data of which update is frequently performed may be managed not to be written in the memory block having the first or second level. To this end, the semiconductor memory device 100 may transfer, to the memory controller 1100, information indicating whether a memory block corresponds to the bad block or the first or second level block. As described above, the semiconductor memory device 100 can segment and manage a current leakage degree of the memory block.

Although an embodiment in which the target memory block is determined as a first or second level block or a bad block is illustrated in FIG. 19, this is merely an example; more than two levels indicative of various degrees of badness may be used, and the target memory block may be determined to be of any of those levels as well as a bad block.

Figure 20:
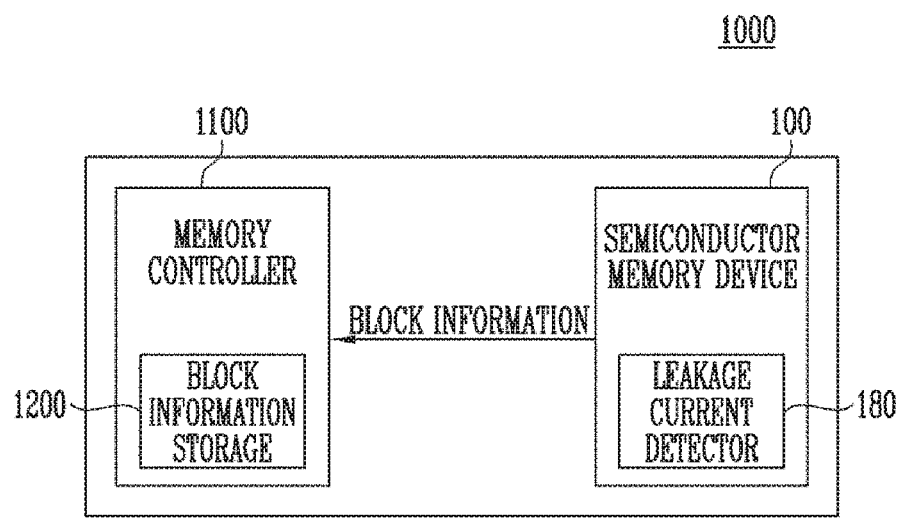
FIG. 20 is a block diagram illustrating a memory system according to an embodiment of the present disclosure.

FIG. 20 is a block diagram illustrating a memory system 1000 according to an embodiment of the present disclosure.

Referring to FIG. 20, the memory system 1000 includes a memory controller 1100 and a semiconductor memory device 100. The semiconductor memory device 100 may include a leakage current detector 180. As described above, the leakage current detector 180 may include the voltage generator 150, the switching controller 125, and the control logic 140, which are shown in FIG. 8. The leakage current detector 180 may detect whether a leakage current is generated in each memory block or a degree of current leakage. Based on this, the semiconductor memory device may transfer, to the memory controller 1100, block information including information indicating whether the memory block correspond to the bad block or the first or second level block as described with reference to FIGS. 8 to 19.

The memory controller 1100 may include a block information storage 1200. The block information storage 1200 may store the block information received from the semiconductor memory device 100. The memory controller 1100 may perform garbage collection, wear leveling or the like, based on the block information stored in the block information storage 1200. The first or second level memory block may be separately managed such that degradation does not occur therein.

In an embodiment, the semiconductor memory device 100 may determine a target memory block as any one of the satisfactory block, the first level block, the second level block or the bad block as shown in FIG. 19. The semiconductor memory device 100 may determine a degree of badness of each of a plurality of memory blocks included therein as any one of the satisfactory block, the first level block, the second level block or the bad block, and transfer the degree of badness to the memory controller 1100. The block information storage 1200 may store information indicating degrees of badness of the plurality of memory blocks included in the semiconductor memory device 100.

Figure 21:
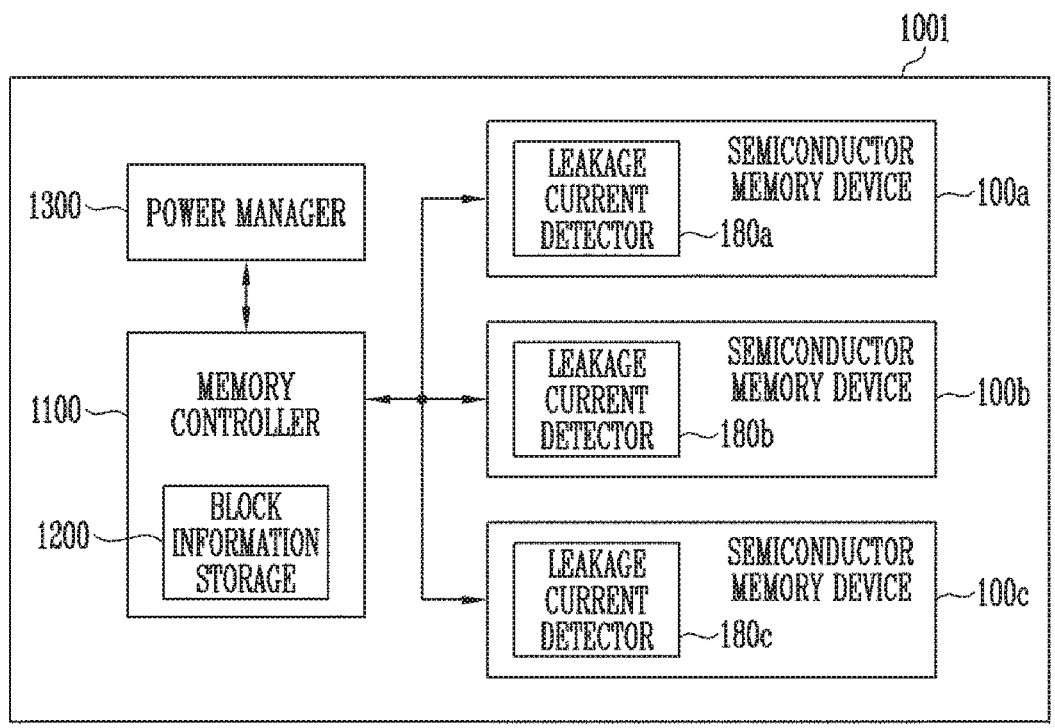
FIG. 21 is a block diagram illustrating a memory system according to another embodiment of the present disclosure.

FIG. 21 is a block diagram illustrating a memory system 1001 according to another embodiment of the present disclosure.

Referring to FIG. 21, the memory system 1001 includes a memory controller 1100, a plurality of semiconductor memory devices 100a, 100b, and 100c, and a power manager 1300.

The power manager 1300 may manage power transferred to the plurality of semiconductor memory devices 100a, 100b, and 100c, and be controlled by the memory controller 1100. An arrangement in which the power manager 1300 is a component separate from the memory controller 1100 is illustrated in FIG. 21. However, in some embodiments, the power manager 1300 may be integrated with the memory controller 1100.

The semiconductor memory devices 100a, 100b, and 100c may include leakage current detectors 180a, 180b, and 180c, respectively. As described above, the leakage current detectors 180a, 180b, and 180c may include the voltage generator 150, the switching controller 125, and the control logic 140, which are shown in FIG. 8. The leakage current detectors 180a, 180b, and 180c may detect whether leakage currents are generated in memory blocks in the semiconductor memory devices 100a, 100b, and 100c or degrees of current leakage, respectively. Based on this, each of the semiconductor memory devices 100a, 100b, and 100c may transfer, to the memory controller 1100, block information including information indicating whether each memory block correspond to the bad block or the first or second level block as described with reference to FIGS. 8 to 19.

The memory controller 1100 may include a block information storage 1200. The block information storage 1200 may store the block information received from the semiconductor memory device 100. The memory controller 1100 may perform garbage collection, wear leveling or the like, based on the block information stored in the block information storage 1200. The first or second level memory block may be separately managed such that degradation does not occur therein.

The block information storage 1200 may store bad block information received from the semiconductor memory device 100. The memory controller may control access of bad blocks based on the bad block information stored in the block information storage 1200.

The memory controller 1100 may provide the power manager 1300 with block information stored in the block information storage 1200. The power manager 1300 may perform management of power supplied to the semiconductor memory devices 100a, 100b, and 100c, based on the received block information. In an example, when current is leaked through multiple memory blocks in the semiconductor memory devices 100a, 100b, and 100c, the power manager 1300 may perform an operation for supplying stable power to the semiconductor memory devices 100a, 100b, and 100c. In another example, when the number of memory blocks through which current is leaked is small, the power manager 1300 may manage the supplied power such that the semiconductor memory devices 100a, 100b, and 100c can operate on reduced power.

Figure 22:
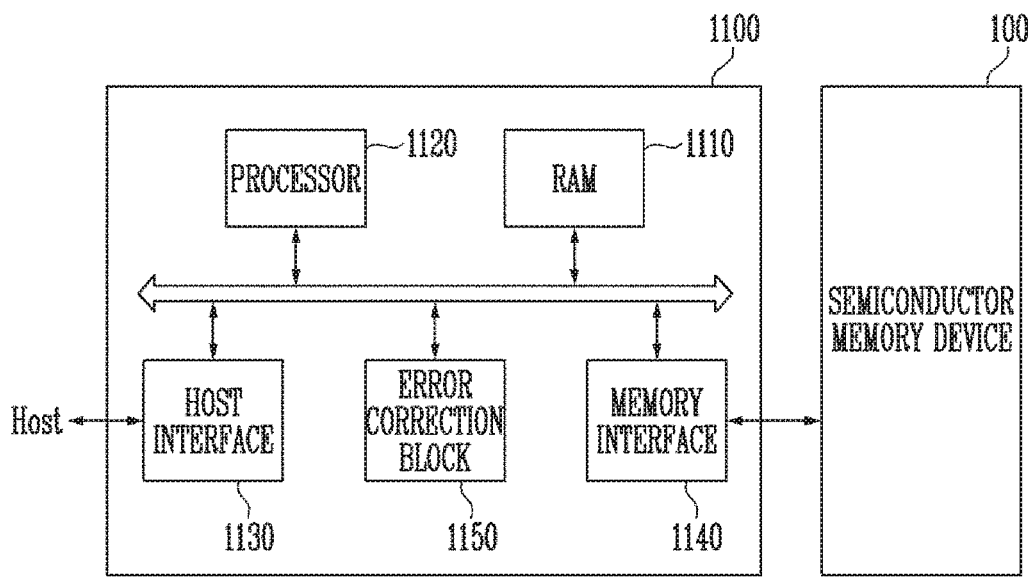
FIG. 22 is a block diagram illustrating another embodiment of the memory system of FIG. 1.

FIG. 22 is a block diagram illustrating another embodiment 1000 of the memory system of FIG. 1.

Referring to FIG. 22, the memory system 1000 includes a semiconductor memory device 100 and the memory controller 1100. The semiconductor memory device 100 may be the semiconductor memory device described with reference to FIGS. 1 and 2, and the memory controller 1100 may be the memory controller described with reference to FIGS. 1 and 20. Overlapping description is thus omitted here.

The memory controller 1100 is connected to a host (Host) and the semiconductor memory device 100. The memory controller 1100 corresponds to the memory controller 1100 of FIGS. 1 and 20. The memory controller 1100 is configured to access the semiconductor memory device 100 in response to a request from the host. For example, the memory controller 1100 is configured to control read, write, erase, and background operations of the semiconductor memory device 100. The memory controller 1100 is configured to provide an interface between the semiconductor memory device 100 and the host. The memory controller 1100 is configured to drive firmware for controlling the semiconductor memory device 100.

The memory controller 1100 includes a random access memory (RAM) 1110, a processor 1120, a host interface 1130, a memory interface 1140, and an error correction block 1150. The RAM 1110 is used as at least one of a working memory of the processing unit 1120, a cache memory between the semiconductor memory device 100 and the host, and a buffer memory between the semiconductor memory device 100 and the host. The processor 1120 controls overall operations of the memory controller 1100. Also, the memory controller 1100 may temporarily store program data provided from the host in a write operation.

The host interface 1130 includes a protocol for exchanging data between the host and the memory controller 1100. In an embodiment, the memory controller 1100 is configured to communicate with the host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processor 1120 may control the semiconductor memory device 100 to adjust a read voltage, based on an error detection result of the error correction block 1150, and to perform re-reading. In an embodiment, the error correction block 1150 may be provided as a component of the memory controller 1100.

The memory controller 1100 and the semiconductor memory device 100 may be integrated into a single semiconductor device. In an embodiment, the memory controller 1100 and the semiconductor memory device 100 may be so integrated to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The memory controller 1100 and the semiconductor memory device 100 may be integrated into a single semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host connected to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 23:
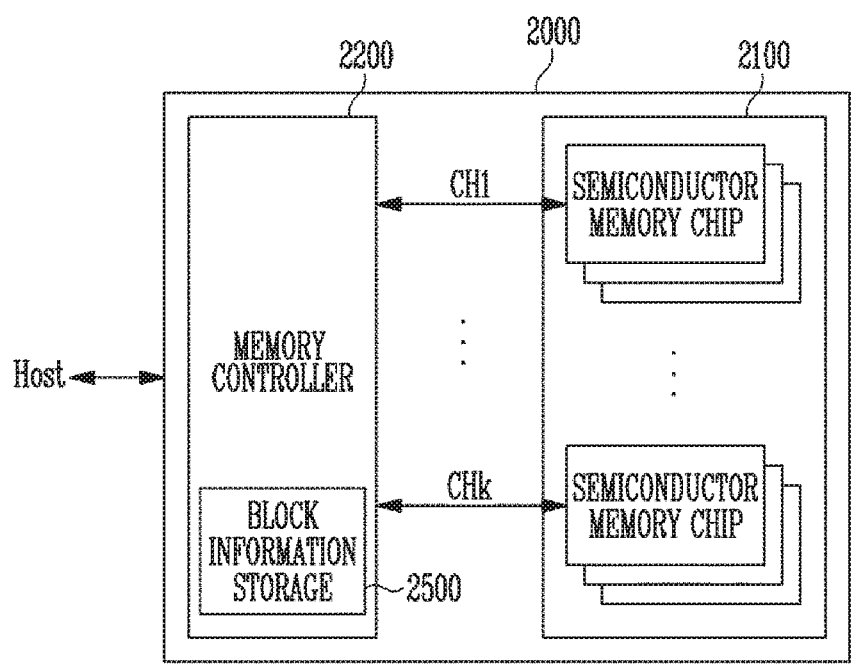
FIG. 23 is a block diagram illustrating an exemplary application of the memory system of FIG. 22.

FIG. 23 is a block diagram illustrating an application example of the memory system of FIG. 22.

Referring to FIG. 23, the memory system 2000 includes a semiconductor memory device 2100 and a memory controller 2200. The semiconductor memory device 2100 includes a plurality of semiconductor memory chips. The plurality of semiconductor memory chips are divided into a plurality of groups.

FIG. 23 illustrates that k groups communicate with the memory controller 2200 through first to kth channels CH1 to CHk respectively. Each semiconductor memory chip may be configured and operated identically to the semiconductor memory device 100 described with reference to FIG. 2.

Each semiconductor memory chip of a particular group is configured to communicate with the memory controller 2200 through one common channel. The memory controller 2200 is configured similarly to the memory controller 1100 described with reference to FIG. 14 or 17. The memory controller 2200 is configured to control the plurality of memory chips of the semiconductor memory device 2100 through the plurality of channels CH1 to CHk.

The memory controller 2200 may include a block information storage 2500. The block information storage 2500 may store block information received from the semiconductor memory device 2100. More specifically, the memory controller 2200 may perform garbage collection, wear leveling or the like, based on the block information stored in the block information storage 2500. A first or second level memory block may be separately managed such that degradation does not occur therein.

In an embodiment, each semiconductor memory chips of the semiconductor memory device 2100 may include a plurality of memory blocks. The semiconductor memory chip may determine a target memory block as any one of a satisfactory block, the first level block, the second level block, and a bad block. The semiconductor memory chip may determine a degree of badness of each of the plurality of memory blocks included therein as any one of the satisfactory block, the first level block, the second level block or the bad block, and transfer information indicating the degree of badness to the memory controller 2200. The block information storage 2500 may store information indicating degrees of badness of the plurality of memory blocks included in each of the plurality of semiconductor memory chips included in the semiconductor memory device 2100.

Figure 24:
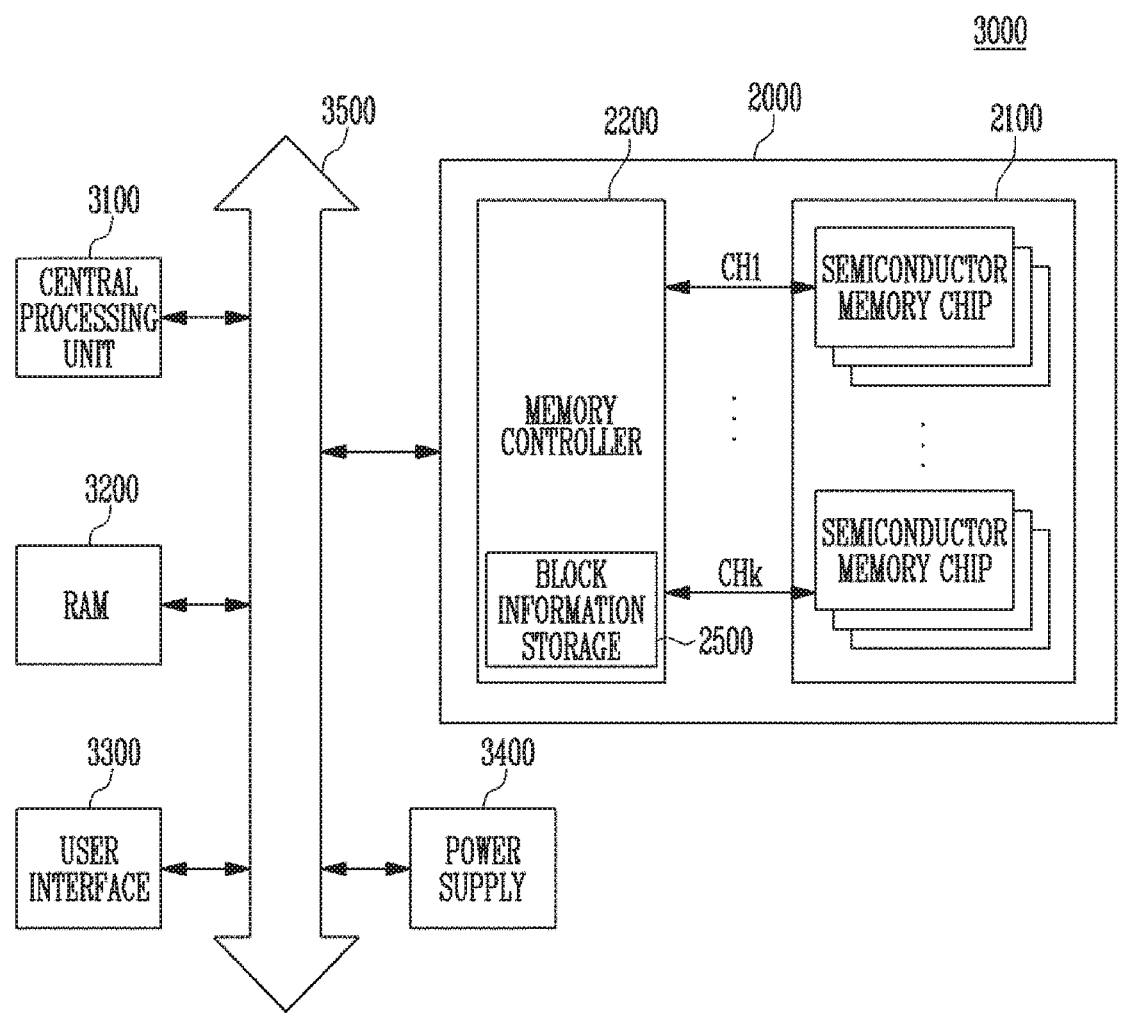
FIG. 24 is a block diagram illustrating a computing system including the memory system described with reference to FIG. 23 according to an embodiment of the present disclosure.

FIG. 24 is a block diagram illustrating a computing system including the memory system described with reference to FIG. 23.

Referring to FIG. 24, the computing system 3000 includes a central processing unit (CPU) 3100, a RAM 3200, a user interface 3300, a power supply 3400, a system bus 3500, and a memory system 2000.

The memory system 2000 is electrically connected to the central processing unit 3100, the RAM 3200, the user interface 3300, and the power supply 3400 through the system bus 3500. Data supplied through user interface 3300 or data processed by the central processing unit 3100 are stored in the memory system 2000.

FIG. 24 illustrates that the semiconductor memory device 2100 is connected to the system bus 3500 through the memory controller 2200. However, the semiconductor memory device 2100 may be directly connected to the system bus 3500. The function of the memory controller 2200 may be performed by the central processing unit 3100 and the RAM 3200.

The memory controller 2200 may include a block information storage 2500. The block information storage 2500 may store block information received from the semiconductor memory device 2100. More specifically, the memory controller 2200 may perform garbage collection, wear leveling or the like, based on the block information stored in the block information storage 2500. A first or second level memory block may be separately managed such that degradation does not occur therein.

FIG. 24 illustrates that the memory system 2000 described with reference to FIG. 23 is provided. However, the memory system 2000 may be replaced by the memory system 1000 described with reference to FIG. 22. In an embodiment, the computing system 3000 may be configured to include both of the memory systems 1000 and 2000 described with reference to FIGS. 22 and 23.

According to embodiments of the present disclosure, a semiconductor memory device, an operating method thereof, and a memory system are provided to measure a leakage current of a word line.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a switching controller connected to a local word line and including a first switching circuit and a second switching circuit;
a voltage generator, connected to the switching controller, configured to generate an operating voltage according to an input clock signal and transfer the operating voltage to the switching controller; and
control logic configured to control operations of the voltage generator and the switching controller,
wherein the control logic is configured to:
count a number of pulses of the input clock signal during a measurement period, as a first reference clock number and a second reference clock number, using a first reference current of a reference current source and a second reference current of the reference current source when the first switching control signal is enabled and the second switching control signal is disabled;
calculate a third reference clock number corresponding to a third reference current based on the first reference clock number and the second reference clock number;
count the number of pulses of the input clock signal during the measurement period, as target clock number, using leakage current of the local word line when the first and second switching control signals are enabled;
detect an amount of the leakage current of the local word line by counting the number of pulses of the input clock signal; and
determine whether current is leaked through a memory block connected to the local word line by comparing the third reference clock number with the target clock number.

2. The semiconductor memory device of claim 1, wherein the voltage generator includes:
a charge pump configured to receive the input clock signal to generate an output voltage;
a voltage comparator configured to generate an enable signal by comparing the output voltage of the charge pump with a reference voltage;
a clock input driver configured to generate the input clock signal, applied to the charge pump, based on the enable signal;
a voltage regulator configured to regulate the output voltage of the charge pump; and
the reference current source connected to an output terminal of the voltage regulator.

3. The semiconductor memory device of claim 2,
wherein the voltage comparator is configured to receive the output voltage of the charge pump and the reference voltage, to output the enable signal when the output voltage of the charge pump is less than the reference voltage,
wherein the clock input driver receives the enable signal and an external clock signal to generate the input clock signal.

4. The semiconductor memory device of claim 2, wherein
the first switching circuit is configured to receive the first switching control signal, to connect the output terminal of the voltage regulator and a global word line when the first switching control signal is enabled; and
wherein the second switching circuit is configured to receive the second switching control signal, to selectively connect the global word line and the local word line when the second switching control signal is enabled.

5. The semiconductor memory device of claim 4, wherein the control logic calculates the third reference clock number based on the following expression:

$$CNT3 = \frac{I_{REF3} - I_{REF2}}{I_{REF1} - I_{REF2}} \cdot (CNT1 - CNT2) + CNT2$$

wherein $I_{REF1}$ is the first reference current, $I_{REF2}$ is the second reference current, $I_{REF3}$ is the third reference current, CNT1 is the first reference clock number, CNT2 is the second reference clock number, and CNT3 is the third reference clock number.

6. The semiconductor memory device of claim 1, wherein the control logic includes:
a counter configured to count the reference clock number and the target clock number by receiving the input clock signal;
a first register configured to store the reference clock number;
a second register configured to store the target clock number; and
a comparison calculator configured to compare the reference clock number and the target clock number, and determine the memory block to be a bad block when the target clock number is greater than the reference clock number.

7. The semiconductor memory device of claim 1, wherein the control logic includes:
a counter configured to count the first reference clock number, the second reference clock number, and the target clock number by receiving the input clock signal;
a first register configured to store the first reference clock number;
a second register configured to store the second reference clock number;
a first comparison calculator configured to calculate the third reference clock number by comparing the first reference clock number and the second reference clock number;
a third register configured to store the third reference clock number;
a fourth register configured to store the target clock number; and
a second comparison calculator configured to compare the third reference clock number and the target clock number, and determine the memory block to be a bad block when the target clock number is greater than the third reference clock number.

8. A memory system comprising:
a plurality of semiconductor memory devices;
a power manager configured to manage power transferred to the plurality of semiconductor memory devices; and
a memory controller configured to control operations of the plurality of semiconductor memory devices and the power manager,
wherein each of the plurality of semiconductor memory devices includes:
a memory cell array including a plurality of memory blocks; and
a leakage current detector configured to detect a leakage current of each of the plurality of memory blocks,
wherein the leakage current detector includes:
a switching controller connected to the memory cell array through a local word line, the switching controller including a first switching circuit and a second switching circuit;

a voltage generator connected to the switching controller, the voltage generator generating an operating voltage according to an input clock signal and transferring the operating voltage to the switching controller; and a control logic configured to control operations of the voltage generator and the switching controller, and wherein the control logic is configured to:

count a number of pulses of the input clock signal during a measurement period, as a first reference clock number and a second reference clock number, using a first reference current of a reference current source and a second reference current of the reference current source when the first switching control signal is enabled and the second switching control signal is disabled;

calculate a third reference clock number corresponding to a third reference current based on the first reference clock number and the second reference clock number;

count the number of pulses of the input clock signal during the measurement period, as target clock number, using leakage current of the local word line when the first and second switching control signals are enabled;

detect an amount of the leakage current of the local word line by counting the number of pulses of the input clock signal; and determine whether current is leaked through a memory block connected to the local word line by comparing the third reference clock number with the target clock number.

9. The memory system of claim 8, wherein each of the plurality of semiconductor memory devices generates block information indicating a leakage current of each of the plurality of memory blocks and transfers the block information to the memory controller.

10. The memory system of claim 9, wherein the memory controller includes a block information storage configured to store the block information.

11. The memory system of claim 10, wherein the memory controller transfers the block information stored in the block information storage to the power manager, and wherein the power manager manages power supplied to the plurality of semiconductor memory devices based on the block information.

12. The memory system of claim 8, wherein the leakage current detector includes:

a voltage generator configured to generate an output voltage and increase the output voltage according to oscillations of a clock when the output voltage is less than a reference voltage;

the reference current source coupled to an output node of the voltage generator;

a switch configured to control a connection between a local word line and a global word line coupled to the output node; and control logic configured to determine the memory block coupled to the local word line to be a bad block when a target oscillation number of the clock is greater than a reference oscillation number of the clock.

13. The memory system of claim 12, wherein the memory controller controls access of the bad block determined by the control logic of the leakage current detector.

* * * * *